(12) United States Patent
Meyer et al.

(10) Patent No.: US 11,302,668 B2
(45) Date of Patent: *Apr. 12, 2022

(54) MULTI-PURPOSE NON-LINEAR SEMICONDUCTOR PACKAGE ASSEMBLY LINE

(71) Applicant: Infineon Technologies AG, Neubiberg (DE)

(72) Inventors: Thorsten Meyer, Regensburg (DE); Gerald Ofner, Regensburg (DE); Stephan Bradl, Regensburg (DE); Stefan Miethaner, Regensburg (DE); Alexander Heinrich, Bad Abbach (DE); Horst Theuss, Wenzenbach (DE); Peter Scherl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/720,867

(22) Filed: Dec. 19, 2019

(65) Prior Publication Data
US 2020/0203310 A1   Jun. 25, 2020

Related U.S. Application Data

(63) Continuation of application No. 15/284,580, filed on Oct. 4, 2016, now Pat. No. 10,566,309.

(51) Int. Cl.
*H01L 21/677* (2006.01)
*H01L 21/56* (2006.01)
(Continued)

(52) U.S. Cl.
CPC .......... *H01L 24/96* (2013.01); *H01L 21/4825* (2013.01); *H01L 21/4839* (2013.01);
(Continued)

(58) Field of Classification Search
None
See application file for complete search history.

(56) References Cited

U.S. PATENT DOCUMENTS

| 5,402,350 A | 3/1995 | Kline |
| 5,701,627 A | 12/1997 | Matsumura et al. |

(Continued)

FOREIGN PATENT DOCUMENTS

| CN | 104051334 A | 9/2014 |
| CN | 105575852 A | 5/2016 |

(Continued)

OTHER PUBLICATIONS

Unknown, "Non-linear", en.oxforddictionaries.com, Oxford Dictionaries, n.d. Web, Mar. 23, 2018, 1-5.

(Continued)

*Primary Examiner* — Jay C Chang
(74) *Attorney, Agent, or Firm* — Murphy, Bilak & Homiller, PLLC

(57) ABSTRACT

A method of producing packaged semiconductor devices includes providing a first packaging substrate panel, providing a second packaging substrate panel, and moving the first and second packaging substrate panels through an assembly line that comprises a plurality of package assembly tools using a control mechanism. First type packaged semiconductor devices are formed on the first packaging substrate panel and second type packaged semiconductor devices are formed on the second packaging substrate panel. The control mechanism moves both of the first and packaging substrate panels through the assembly line in a non-linear manner. The first and second packaged semiconductor devices differ with respect to at least one of: lead configuration, and encapsulant configuration.

10 Claims, 21 Drawing Sheets

(51) Int. Cl.
*H01L 21/67* (2006.01)
*H01L 21/48* (2006.01)
*H01L 21/78* (2006.01)
*H01L 23/00* (2006.01)
*H01L 23/495* (2006.01)
*H01L 23/31* (2006.01)

(52) U.S. Cl.
CPC .......... *H01L 21/561* (2013.01); *H01L 21/677* (2013.01); *H01L 21/67011* (2013.01); *H01L 21/67703* (2013.01); *H01L 21/78* (2013.01); *H01L 23/3114* (2013.01); *H01L 23/4952* (2013.01); *H01L 23/49503* (2013.01); *H01L 23/49541* (2013.01); *H01L 23/49548* (2013.01); *H01L 23/49582* (2013.01); *H01L 24/97* (2013.01); *H01L 21/565* (2013.01); *H01L 21/568* (2013.01); *H01L 23/3107* (2013.01); *H01L 24/83* (2013.01); *H01L 24/85* (2013.01); *H01L 2224/0603* (2013.01); *H01L 2224/291* (2013.01); *H01L 2224/32245* (2013.01); *H01L 2224/48247* (2013.01); *H01L 2224/49111* (2013.01); *H01L 2224/73265* (2013.01); *H01L 2224/83005* (2013.01); *H01L 2224/8384* (2013.01); *H01L 2224/85005* (2013.01); *H01L 2224/92247* (2013.01); *H01L 2224/97* (2013.01); *H01L 2924/181* (2013.01)

(56) References Cited

U.S. PATENT DOCUMENTS

| | | |
|---|---|---|
| 5,745,364 A | 4/1998 | Togashi et al. |
| 10,566,309 B2 * | 2/2020 | Meyer ............... H01L 21/67703 |
| 2002/0017708 A1 | 2/2002 | Takagi et al. |
| 2004/0225385 A1 | 11/2004 | Takagi et al. |
| 2005/0133340 A1 | 6/2005 | Horn |
| 2006/0284299 A1 * | 12/2006 | Karnezos ................ H01L 25/16 257/686 |
| 2014/0135968 A1 | 5/2014 | Lee et al. |
| 2015/0279796 A1 * | 10/2015 | Tu ........................ H01L 21/78 257/737 |
| 2016/0118332 A1 * | 4/2016 | Lin ....................... H01L 21/486 257/773 |
| 2016/0118333 A1 * | 4/2016 | Lin ........................ H01L 25/16 257/773 |

FOREIGN PATENT DOCUMENTS

| | | |
|---|---|---|
| EP | 1898447 A2 | 3/2008 |
| WO | 9726675 A1 | 7/1997 |
| WO | 2011130888 A1 | 10/2011 |

OTHER PUBLICATIONS

Unknown, "Package", Merriam-Webster.com, Merriam-Webster, n.d. Web., Mar. 25, 2018, 1-20.
Unknown, "Type", Merriam-Webster.com, Merriam-Webster, n.d. Web, Mar. 25, 2018, 1-27.

\* cited by examiner

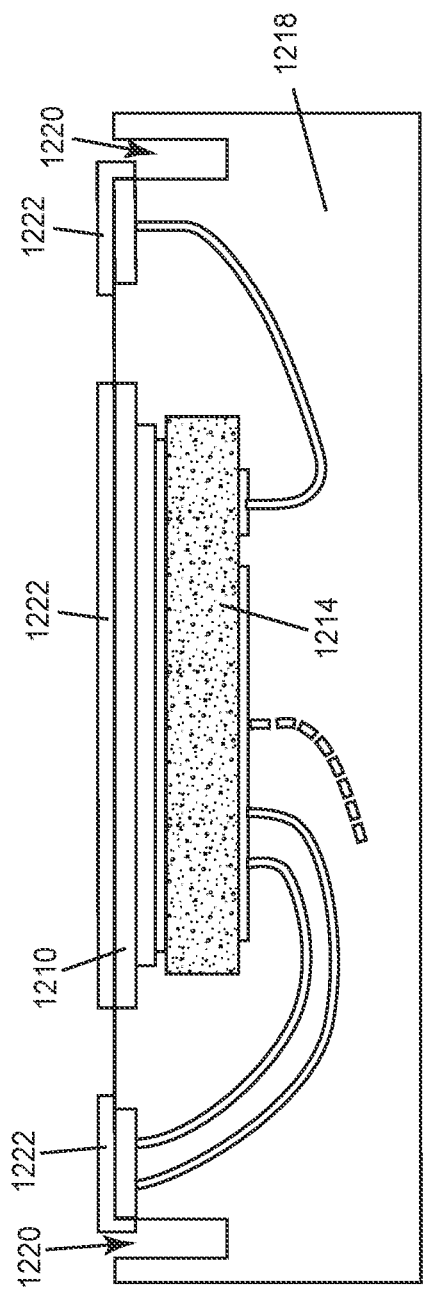
FIG. 15A
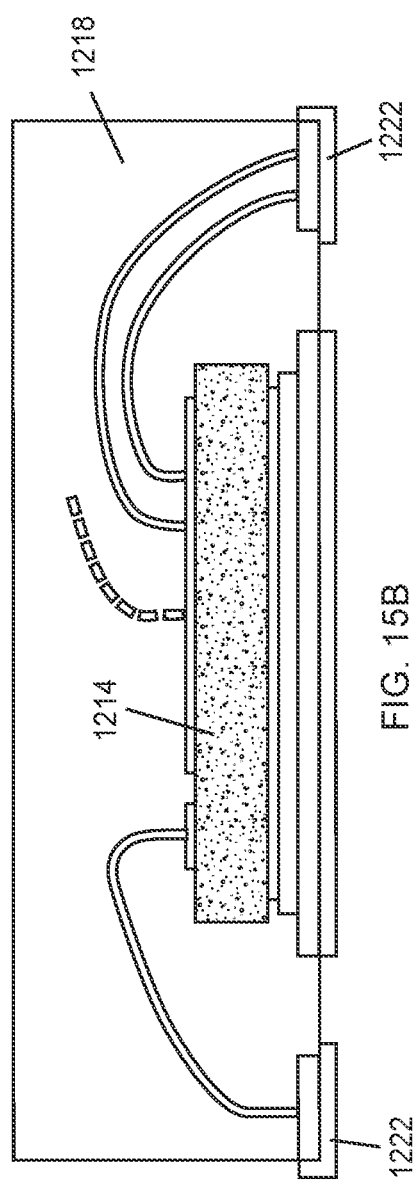
FIG. 15B
FIGURE 15

MULTI-PURPOSE NON-LINEAR SEMICONDUCTOR PACKAGE ASSEMBLY LINE

FIELD OF TECHNOLOGY

The present application relates to semiconductor packaging, and more particularly relates to high volume package assembly lines.

BACKGROUND

Semiconductor packaging is used to protect an integrated circuit (e.g., microprocessor, microcontroller, ASIC device, sensor, power transistor, etc.) and to provide an electrical and thermal interface between the integrated circuit and an external component, such as a printed circuit board. Typically, a semiconductor package is designed to protect the integrated circuit from potentially damaging environmental conditions, such as extreme temperature variations, moisture, dust particles, etc. In addition, the semiconductor package includes external terminals (e.g., leads, pads, etc.) that provide an electrical interface between the terminals of the integrated circuit and the external component.

A variety of different package types have been developed as the semiconductor industry has evolved. One of the first package types developed was the so-called TO (transistor outline) package, which encapsulates a single semiconductor die, such as a transistor or diode, and includes two or three leads directly extending out of the encapsulant portion. One package type that followed the TO package is the so called DIP (dual in-line package), which offers a higher lead count and more I/O capability than the TO package. One package type that followed the DIP package is the so-called QFP (quad-flat-package), which offers a high lead count due to the provision of "gull wing" style leads on each of the four sides of the package. From there, so-called surface mount packages evolved. Surface mount packages include flat pads instead of leads, and therefore reduce space. An example of a surface mount package is a BGA (ball grid array), which features a grid array of solder balls on a bottom side of the package that are used to provide external electrical terminals.

To date, there are a large number of standard package types that are commercially available and widely used. Examples of these package types include the DIP (dual in-line package), LGA (land grid array), MCM (multi-chip module), LCC (leaded chip carrier), PGA (pin grid array), CFP (ceramic flat pack), QFN (quad flat no-leads), TSOP (thin small-outline package) and WLB (Wafer Level Ball Grid Array). There is substantial diversity in the internal construction of these packages and substantial variation in the processes used to make any one of these package types. Wiring techniques can vary (e.g., wire bonding, solder bump, thin film attach, etc.). Encapsulation techniques can vary (e.g., transfer molding, compression molding, lamination, etc.). The driving factors that motivate one to select package types and process techniques over another include cost, electrical performance, thermal performance, interconnect density, system integration capability and reliability. Typically, in the life cycle of a product, performance is initially the most important consideration, but as the product phases through its life cycle, cost becomes the dominant factor.

One approach to reducing package assembly cost is to utilize parallel processing techniques. Parallel processing refers to a technique whereby the same packaging process (e.g., wire bonding, die attach, encapsulation, etc.) is performed on multiple packaging sites simultaneously. An example of this technique involves using a lead-frame strip with a high number of identical unit cells (e.g., 10, 20, 50, etc.), with each unit cell having the lead construction of the desired package type. The lead frame strips are loaded into various packaging tools (e.g., a die attach tool, a molding tool, a lead trimming tool, etc.) and package processing is applied to each unit cell in the lead-frame strip simultaneously. Eventually, the unit lead frames are singulated and a number of identical packages are produced.

To date, package assembly lines are built to produce a single package type (e.g., CFP, QFN, TSOP etc.) Each package assembly line requires investment, planning, build of materials, flow design, tooling, and a manufacture location that is dedicated to producing only one type of package. These factors lead to increased cost for each package.

SUMMARY

A method of producing packaged semiconductor devices is disclosed. According to an embodiment, the method includes providing a first packaging substrate panel. A second packaging substrate panel is provided. The first and second packaging substrate panels are moved through an assembly line that includes a plurality of package assembly tools using a control mechanism. First type packaged semiconductor devices are formed on the first packaging substrate panel and second type packaged semiconductor devices are formed on the second packaging substrate panel. The second type packaged semiconductor device is different than the first type packaged semiconductor device. The control mechanism moves both of the first and second packaging substrate panels through the assembly line in a non-linear manner.

According to another embodiment, the method includes providing first and second packaging substrate panels, each panel including a plurality of packaging sites. An assembly line including a plurality of processing tools that are configured to perform package processing to each packaging site in the first and second panels is provided. A control mechanism that is configured to identify the first and second packaging substrate panels and to load the first and second panels into each one of the processing tools in the assembly line in a non-linear manner is provided. The first panel is moved through the assembly line using the control mechanism to form first package type packages. The second panel is moved through the assembly line using the control mechanism to form second package type packages that are different from the first package type. The control mechanism loads the first panels into only those processing tools in the assembly line that are required to produce the first package type and loads the second panels into only those processing tools in the assembly line that are required to produce the second package type.

According to another embodiment, the method includes providing a plurality of packaging substrate panels, each panel having the same size and being at least 24"×18". An assembly line having a plurality of processing tools that are compatible with 24"×18" panels is provided. A first group of the processing tools in the assembly line is configured to perform each package processing step for a first package type, and a second group of the processing tools in the assembly line that is different from the first group is configured to perform each package processing step for a second package type that is different from the first package type. A control mechanism that is configured to identify a substrate panel that is in the assembly line and to load the identified panel into any one of the processing tools in the first and second groups is provided. The control mechanism is used to identify a packaging substrate panel and determine whether the identified panel comprises first or second package type packaging sites, to load the identified panel into one of the processing tools in the first group in the case that the identified panel comprises first package type packaging sites, and to load the identified panel into one of the processing tools in the second group in the case that the identified panel comprises second package type packaging sites.

According to another embodiment, the method includes providing a first packaging substrate panel, providing a second packaging substrate panel, and moving the first and second packaging substrate panels through an assembly line that comprises a plurality of package assembly tools using a control mechanism. First type packaged semiconductor devices are formed on the first packaging substrate panel and second type packaged semiconductor devices are formed on the second packaging substrate panel. The control mechanism moves both of the first and packaging substrate panels through the assembly line in a non-linear manner. The first and second packaged semiconductor devices differ with respect to at least one of: lead configuration, and encapsulant configuration.

According to another embodiment, the method includes providing first and second packaging substrate panels, each packaging substrate panel comprising a plurality of packaging sites, providing an assembly line comprising a plurality of processing tools that are configured to perform package processing to each packaging site in the first and second packaging substrate panels, providing a control mechanism that is configured to identify the first and second packaging substrate panels and to load the first and second packaging substrate panels into each one of the processing tools in the assembly line in a non-linear manner, moving the first packaging substrate panel through the assembly line using the control mechanism to form first package type packages, and moving the second packaging substrate panel through the assembly line using the control mechanism to form second package type packages that are different from the first package type packages. The control mechanism loads the first packaging substrate panels into only those processing tools in the assembly line that are required to produce the first package type packages and loads the second packaging substrate panels into only those processing tools in the assembly line that are required to produce the second package type packages. The processing tools in the assembly line that are required to produce the first package type packages are different from the processing tools in the assembly line that are required to produce the second package type packages. The first and second packaged semiconductor devices differ with respect to at least one of: lead configuration, and encapsulant configuration.

According to another embodiment, the method includes providing a plurality of packaging substrate panels, each panel having the same size and being at least 24"×18", providing an assembly line comprising a plurality of processing tools that are compatible with 24"×18" panels, wherein a first group of the processing tools in the assembly line is configured to perform each package processing step for a first package type, and wherein a second group of the processing tools in the assembly line that is different from the first group is configured to perform each package processing step for a second package type that is different from the first package type, providing a control mechanism that is configured to identify a substrate panel that is in the assembly line and to load the identified panel into any one of the processing tools in the first and second groups. Using the control mechanism to identify a packaging substrate panel and determine whether the identified panel comprises first or second package type packaging sites, load the identified panel into one of the processing tools in the first group in the case that the identified panel comprises first package type packaging sites, and load the identified panel into one of the processing tools in the second group in the case that the identified panel comprises second package type packaging sites. The first and second packaged semiconductor devices differ with respect to at least one of: lead configuration, and encapsulant configuration.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 5A, 5B and 5C, depicts a method of adapting packaging substrate panels, according to an embodiment. FIG. 5A depicts a method of adapting a packaging substrate panel for a first package type. FIG. 5B depicts a method of adapting a packaging substrate panel for a second package type, and FIG. 5C depicts a method of adapting a packaging substrate panel for a third package type.

FIG. 10, which includes

FIG. 11, which includes

FIGS. 12A, 12B and 12C, depicts selected process steps for forming a VQFN type package using a non-linear package assembly line, according to an embodiment.

FIGS. 13A, 13B and 13C, depicts selected process steps for forming a VQFN type package using a non-linear package assembly line, according to an embodiment.

FIGS. 14A and 14B, depicts selected process steps for forming a VQFN type package using a non-linear package assembly line, according to an embodiment.

FIG. 15, which includes FIGS. 15A and 15B, depicts selected process steps for forming a VQFN type package using a non-linear package assembly line, according to an embodiment.

FIGS. 16A, 16B and 16C, depicts selected process steps for forming a VQFN type package using a non-linear package assembly line, according to another embodiment that is different than the embodiment described with reference to FIGS. 12-15.

FIGS. 17A, 17B and 17C, depicts selected process steps for forming a VQFN type package using a non-linear package assembly line, according to another embodiment that is different than the embodiment described with reference to FIGS. 12-15.

DETAILED DESCRIPTION

Embodiments described herein include methods of packaging various semiconductor devices in a variety of different package types (e.g., CFP, QFN, TSOP, etc.) simultaneously. These packages are produced using panels that are adapted to the required package type during the manufacturing process. The panels may be very large in size (e.g., 18"×24"). The exact number of packaging sites per panel will vary depending upon the package type and the package size. Using an 8 mm² package footprint as an example, one of these very large panels can be used to produce approximately 4,000 packages. Each of the package assembly tools in the assembly line are compatible with these very large size panels and can perform package construction steps to each package site on these panels. Examples of the package assembly tools include molding tools, wire bonders, laminators, spray cleaning tools, metal plating tools, etc. By using the very large panel sizes in the assembly line, parallelization is increased and cost per-package is decreased.

According to advantageous embodiments described herein, a non-linear assembly line is used in conjunction with a panel movement control mechanism to perform the necessary processing steps for different package types simultaneously. According to a non-linear processing technique, package lots (i.e., panels or groups of panels) do not pass sequentially from one package assembly tool to the next in a linear order through the assembly line. Instead, a particular package lot that is associated with a first package type (e.g., QFN) moves through a selected group of package assembly tools that is associated with the first package type. Meanwhile, a second package lot associated with a second, different package type (e.g., WLB) passes through a through a different group of package assembly tools that is associated with the second package type, and may move through common processing tools in a different order. In other words, the non-linear process is able to change the order of processing steps and skip or add processing steps altogether, based upon the package type. This made possible by a control mechanism that can move a package lot to any one of the process tools in the assembly line after completion of each processing step. The control mechanism identifies each lot, determines which kind of package type or types are included in the identified lot, and loads the lot in the appropriate processing tool (or the queue for the appropriate processing tool). In this way, the control mechanism controls the flow of the package lots through the assembly line and ensures that each lot is placed in only those processing tools that are necessary for the production of the package type to which these lots are associated with. Moreover, the control mechanism can optimize system throughput by monitoring processing tool availability and/or delay times and loading the processing tools based upon a load balancing scheme.

Figure 1:
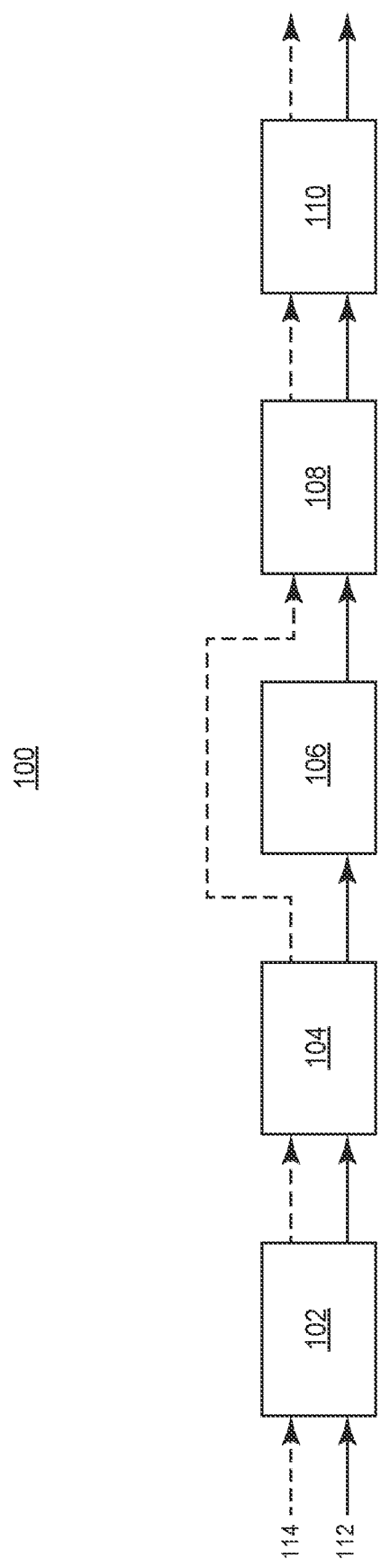
FIG. 1 depicts a linear assembly line, according to an embodiment.

Referring to FIG. 1, a conventional linear package assembly line 100 is depicted, according to an embodiment. This general assembly line format is applicable to any of a variety of commonly known package types (e.g., MCM, LOC, PGA, CFP, QFN, TSOP, etc.). However, this conventional linear package assembly line 100 can typically only produce one of these package types. That is, the conventional linear package assembly line 100 only includes the kind of processing tools that produce a certain package type, and is physically arranged in a manner to produce this package type. The conventional linear package assembly line 100 includes five processing tools in total, namely, a first processing tool 102, a second processing tool 104, a third processing tool 106, a fourth processing tool 108, and a fifth processing tool 110. These processing tools may be configured to perform packaging steps such as: wire bonding, etching, lamination, injection molding, spray cleaning, electroplating, etching, lead trimming, dicing, etc. For leadframe style packages, the processing tools may be configured to load and process a lead-frame strip with a plurality of unit-lead frames in each lead-frame.

The conventional linear package assembly line 100 is linear in the sense that after a package processing step is completed on one of the package lots by one of the processing tools, this package lot must travel to one of the downstream processing tools. Thus, the order in which the package lots flow through the processing tools is always the same. The only flexibility in this regard is that one or more steps in the order can be skipped, and the package lot can be forwarded to further downstream processing tools. This principle is illustrated by the two process flows for two different package lots provided in FIG. 1. A first package lot 112 flows linearly through the assembly line directly from the first processing tool 102 to the second processing tool 104, and then directly from the second processing tool 104 to the third processing tool 106, and then directly from the third processing tool 106 to the fourth processing tool 108, and then directly from the fourth processing tool 108 to the fifth processing tool 110. A second package lot 114 flows linearly through the assembly line directly from the first processing tool 102 to the second processing tool 104, and then directly from the second processing tool 104 to the fourth processing tool 108, and then directly from the fourth processing tool 108 to the fifth processing tool 110. Thus, the second package lot skips 114 the third processing tool 106. However, both of the first and second package lots 112, 114 flow through the processing tools of the conventional linear package assembly line 100 in the same linear direction.

Typically, in linear assembly lines such as the exemplary assembly line 100 described with reference to FIG. 1, the processing tools require different amounts of time to perform their respective packaging step. This requires buffering between the processing tools, and produces bottlenecks in the process that reduce throughput.

Figure 2:
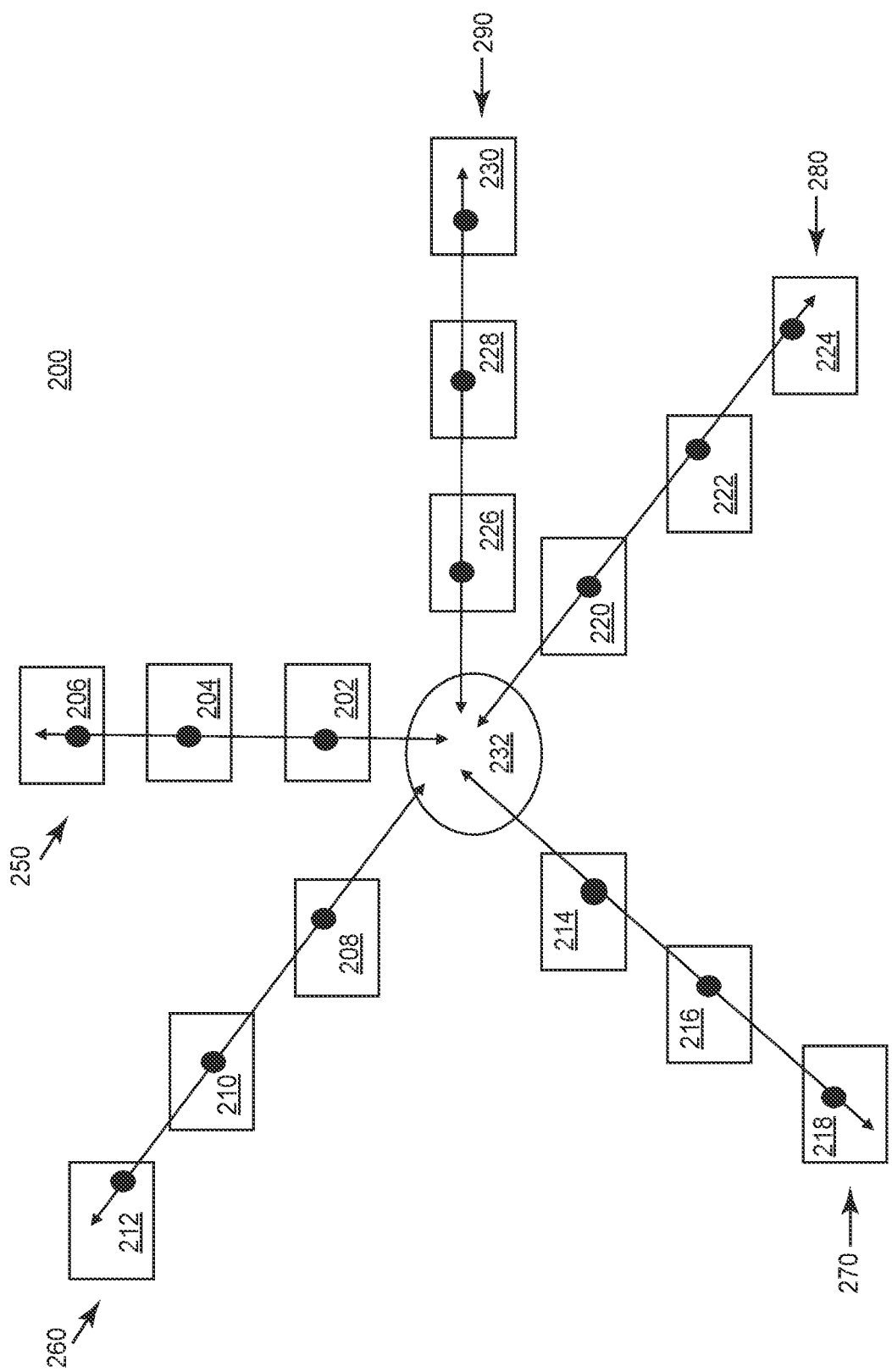
FIG. 2 depicts a non-liner assembly line, according to an embodiment.

Referring to FIG. 2, a non-linear package assembly line 200 is depicted, according to an embodiment. The non-linear package assembly line 200 includes fifteen processing tools in total, namely a first processing tool 202, a second processing tool 204, a third processing tool 206, a fourth processing tool 208, a fifth processing tool 210, a sixth processing tool 212, a seventh processing tool 214, an eighth processing tool 216, a ninth processing tool 218, a tenth processing tool 220, an eleventh processing tool 222, a twelfth processing tool 224, a thirteenth processing tool 226, a fourteenth processing tool 228, and a fifteenth processing tool 230. The processing tools are grouped into clusters, namely a first cluster 250, a second cluster 260, a third cluster 270, a fourth cluster 280, and a fifth cluster 290. Each cluster includes three of the processing tools. This is just one example, and the total number of processing tools, the total number of clusters, and the number of processing tools in each cluster may vary.

The assembly line 200 is non-linear in the sense that after a package lot completes processing in one of the processing tools, this package lot can travel to any one of the processing tools in the assembly line 200, including any of the processing tools that have previously been used for this package lot. Thus, the potential processing steps than can be applied to a particular package lot is orders of magnitude higher than the linear package assembly line 100 described with reference to FIG. 1. Moreover, two different package lots can pass through the non-linear assembly line 200 and receive unique package processing simultaneously. For example, a first packaging lot can pass through the assembly line 200 and receive package processing that is unique to a first package type (e.g., VQFN, SON, TON, etc.), and a second packaging lot can pass through the assembly line 200 and receive package processing that is unique to a second package type (e.g., leadless DS, eWLB, WLB, etc.). Various processing steps that are required for one package type, but not the other, can be performed simultaneously on the first and second packaging lots. This is not possible using the conventional linear assembly line described with reference to FIG. 1.

The non-linear package assembly line 200 includes a control mechanism 232 that facilitates movement of the various packaging lots in manufacture through the assembly line 200. The control mechanism 232 is responsible for, among other things, loading the package lots into the various processing tools in the non-linear package assembly line 200, removing the package lots from the various processing tools after package processing is complete, and forwarding each one of the package lots that is under manufacture to the correct processing tool for subsequent processing.

The control mechanism 232 is configured to identify each one of the package lots that is under manufacture. This can be done by providing a unique identifier on each packaging lot and a corresponding mechanism that is configured to detect the unique identifier. For example, each packaging lot can include a barcode and the control mechanism 232 can include a barcode scanner. Alternatively, a number of barcode scanners can be distributed throughout the assembly line 200 and have a communicative connection (e.g., wireless or wired connection) with the control mechanism 232. According to another example, each packaging lot can include an RFID transmitter and the control mechanism 232 can include an RFID receiver or be connected to a number of RFID receiver scanners distributed throughout the assembly line.

The control mechanism 232 is configured to use the identification information for each package lot to determine what package type(s) is associated with the identified package lot. For example, the control mechanism 232 can determine whether the identified package lot includes TSLP type packages, SSO8 type packages, VQFN type packages, Fan-Out Wafer Level Package (e.g. eWLB) type packages, etc. This can be done using a lookup table that corresponds a unique identifier of a particular package lot to the package type. The lookup table can be stored in a memory of the control mechanism 232, for example. Alternatively, the package type information can be incorporated into the identifier for each package lot.

The control mechanism 232 can perform identification of the package lots during any one or all of the various processing steps for each package lot under manufacture. For example, the control mechanism 232 can perform package identification at the exit point of each of the processing tools of the non-linear assembly line 200. Alternatively, package identification can be done only after the exit point of each cluster as the package lot passes through the central nucleus of the non-linear assembly line 200.

The control mechanism 232 is configured to determine what sequence of processing steps have been completed and what sequence of processing steps are still required for each package lot under manufacture. This can be done using a catalog stored in a centrally located memory of the control mechanism 232 that associates each lot with an ordered list of steps, and indicates which ones of these steps have been completed. Alternatively, some or all of this information can be stored on the package lot itself. Using the SS08 package type as an example, the control mechanism 232 can determine that a particular lot has already received processing steps including lamination, chip attach, plasma clean, printing, and die-attach. The control mechanism 232 can determine that this particular lot still requires processing steps including (in this order) compression molding, grinding, laser marking, debonding, copper etch, lamination, electroplating, cleaning and separation. Based on this determination, the control mechanism 232 determines that the next processing step required is compression molding, and therefore sends the particular lot to the compression molding tool. Once this process completes, the control mechanism 232 performs an updated identification and determination sequence, and sends the lot to the tool that performs grinding (i.e., the next step in the process). This sequence repeats itself until fabrication is complete.

The control mechanism 232 is configured to optimize the throughput of the non-linear assembly line 200 based upon a number of user defined objectives. Examples of user defined objectives include average processing time for every package lot that passes through the non-liner assembly line, average processing time for a subset of prioritized package lots that pass through the non-liner assembly line, utilization of each processing tool with respect to time or power efficiency, etc. Based on the user defined objectives, the control mechanism 232 can determine an optimal resource allocation routine. The optimal resource allocation routine can account for a variety of factors including current conditions of the non-liner assembly line, such as number of package lots under manufacture, types of packages under manufacture, availability of various processing tools in the assembly line, time required for each processing step, etc.

The user defined objectives and the optimal resource allocation routine can be manually entered by an operator, can be implemented by software that is stored in a memory of the control mechanism 232, or can be implemented one-time programmable hardware that is incorporated in the control mechanism 232.

According to an embodiment, the non-linear package assembly line 200 is configured to use packaging substrate panels to perform parallel processing for each package lot under manufacture. According to this technique, a standard-sized panel is used as a substrate for package formation. This standard-sized panel is passed through the non-linear package assembly line 200. Each standard-sized panel includes a plurality of packaging sites. Each processing tool in the non-linear assembly line is compatible with the panel format such that the processing tools can load the panels, perform their respective package processing step (wire bonding, injection molding, metal etching, etc.) on each packaging site of the panel, and make the panels available for transfer when processing is complete. The panels can be very large and therefore accommodate a high number of packages. For example, according to one embodiment, the panels are 24"×18". Other sizes are possible, and the non-linear package assembly line 200 may be configured to accommodate two or more differently sized panels. The panels can include electrically insulating materials, electrically conductive materials, or both. According to an embodiment, the panels include layers of aluminum, polymer, copper. Examples of these panels include standard PCB fabrication panels.

The package lots described herein refer to a group of devices that receive the same processing steps at the same time. These package lots can be transported throughout the non-linear package assembly line 200 using a cassette and track system that is under control by the control mechanism 232. A package lot can be a single panel. Alternatively, a package lot can include multiple panels that are processed in ordered succession at each processing tool, and are transported together in one of more of the cassettes.

Figure 3:
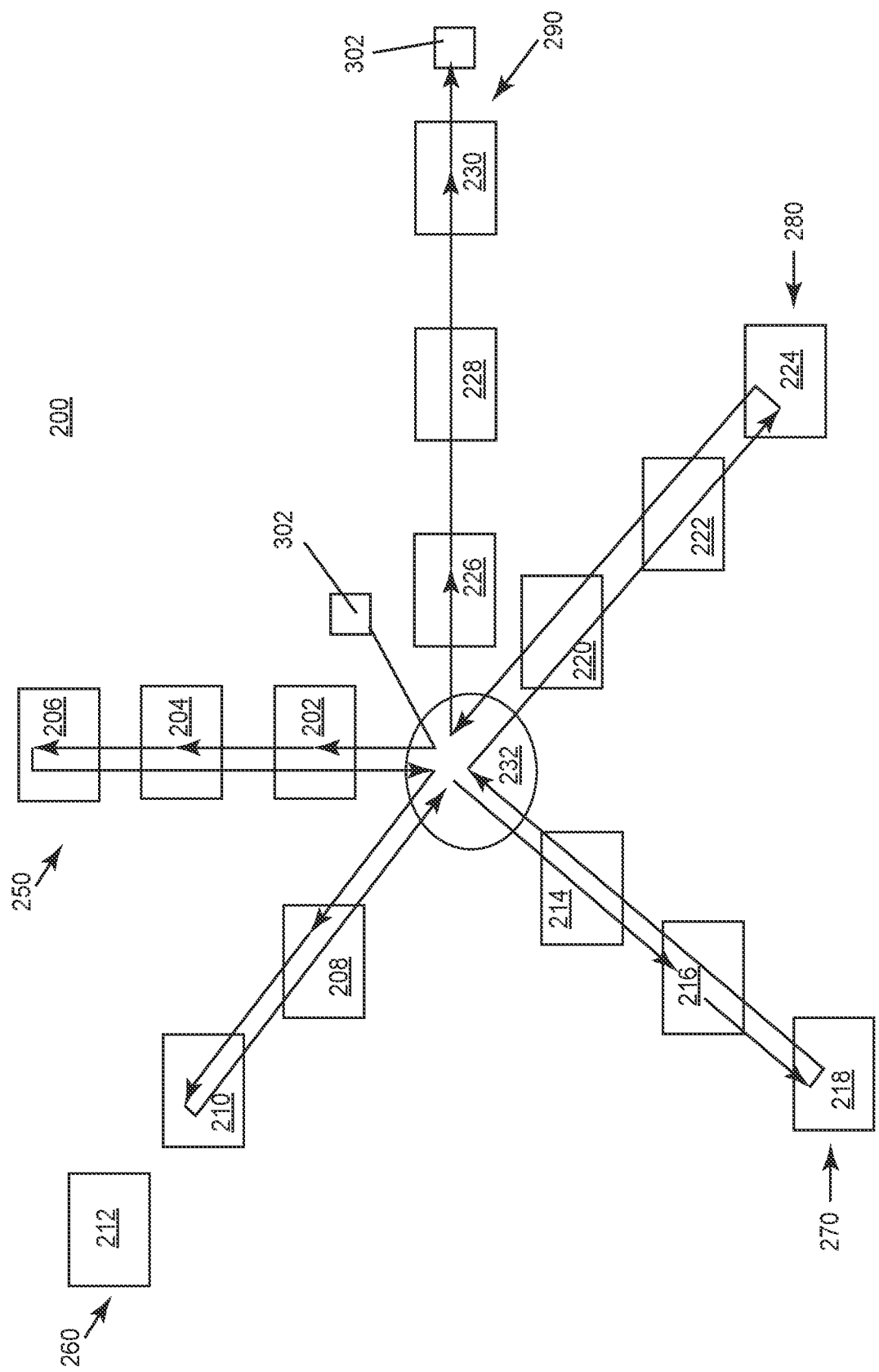
FIG. 3 depicts a process flow for producing first package type semiconductor packages using the non-linear package assembly line, according to an embodiment.

Referring to FIG. 3, a first process flow for producing first package type semiconductor packages using the non-linear package assembly line 200 is depicted. The first package type can be any of a variety of integrated circuit package types including VQFN, SON, TON, leadless Discrete Packages, Fan-Out WLB, Fan-in WLB, embedded die, ATSLP, TSNP, BGA, flip chip package types or any other package type. According to the first process flow, a first package lot 302 of blank panels is provided to the control mechanism 232. The control mechanism 232 moves the first package lot 302 through the non-linear assembly line 200 such that the first package lot 302 is processed by a selected group of processing tools in a specific order. More specifically, the control mechanism 232 moves the first package lot 302 through the non-linear assembly line 200 such that the first package lot 302 is processed sequentially by the first processing tool 202, the second processing tool 204, the third processing tool 206, the fourth processing tool 208, the fifth processing tool 210, the eighth processing tool 216, the ninth processing tool 218, the twelfth processing tool 224, the thirteenth processing tool 226, and the fifteenth processing tool 230. This selected group and order corresponds to the process flow required for forming first package type packages.

Figure 4:
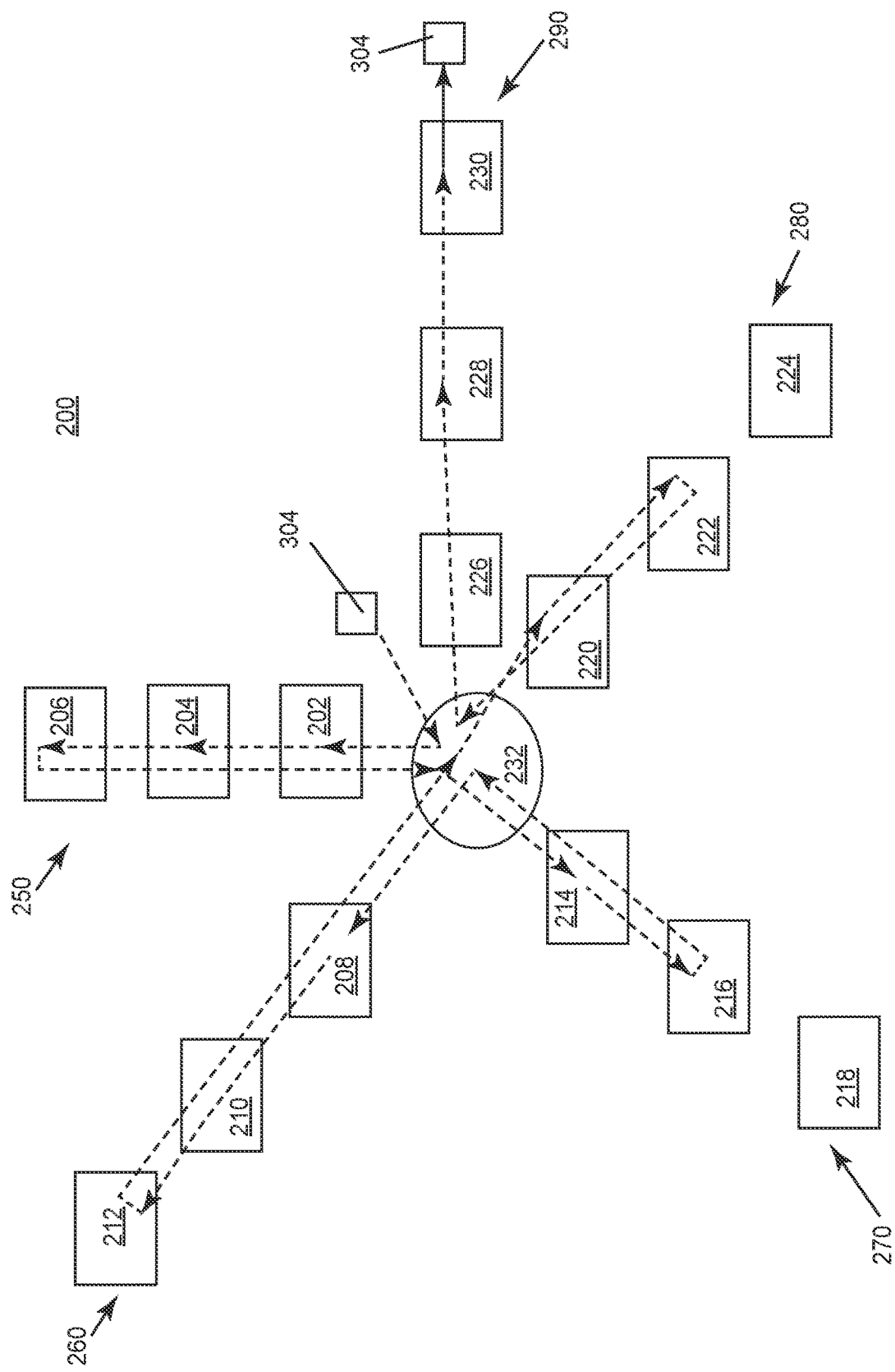
FIG. 4 depicts a process flow for producing second package type semiconductor packages using the non-linear package assembly line, according to an embodiment.

Referring to FIG. 4, a second process flow for producing second package type semiconductor packages using the non-linear package assembly line 200 is depicted. The second package type is different than the first package type, and can be any of a variety of integrated circuit package types including VQFN, SON, TON, leadless Discrete Packages, Fan-Out WLB, Fan-In WLB, embedded die, ATSLP, TSNP, BGA, flip chip package types or any other package type. According to the second process flow, a second package lot 304 of blank panels is provided to the control mechanism 232. The control mechanism 232 moves the second package lot 304 through the non-linear package assembly line 200 such that the first package lot 302 is processed by a selected group of processing tools in a specific order. More specifically, control mechanism 232 moves the first package lot 302 through the non-linear assembly line such that the first package lot 302 is processed sequentially by the first processing tool 202, the second processing tool 204, the third processing tool 206, the seventh processing tool 214, the eighth processing tool 216, the fourth processing tool 208, the sixth processing tool 212, the tenth processing tool 220, the eleventh processing tool 222, the fourteenth processing tool 228, and the fifteenth processing tool 230. This selected group and order corresponds to the process flow required for forming the second package type packages. The second process flow of FIG. 4 can be performed simultaneously with the first process flow of FIG. 3.

Generally speaking, the processing tools of the non-linear package assembly line 200 can be any of a variety of processing tools that are configured to perform one or more of the above listed processing steps. Examples of the processing tools include a molding tool, a laser drilling tool, a mechanical drilling tool, a sputtering tool, a wire bonder, a laminator, a spray cleaning tool, a metal plating tool, and a chemical etching tool.

According to an embodiment, the non-linear package assembly line 200 is organized such that the clusters correspond to classes or sub-classes of package processing steps. For example, the first cluster 250 can be configured to perform panel adaptation. To this end, the first cluster 250 can include adhesive application tool(s), metal etching tool(s), and electroplating tool(s). The second cluster 260 can be configured to perform first level interconnect (i.e., connection between die and package) or second level interconnect (formation of package level terminals). To this end, the second cluster 260 can include wire bonding tool(s), solder ball formation tool(s), solder reflow tool(s), and clip attachment tool(s). The third cluster 270 can be configured to perform die encapsulation. To this end, the third cluster 270 can include compression molding tool(s), transfer molding tool(s), injection molding tool(s), and lamination tool(s). The fourth cluster 280 can be configured to perform wet chemistry. To this end, the fourth cluster 280 can include electroplating tool(s), metal etching tool(s), photoresist tool(s), and plasma cleaning tool(s). The fifth cluster 290 can be configured to perform package separation. To this end, the fifth cluster 290 can include dicing tool(s), and lead trimming tool(s).

Figure 5:
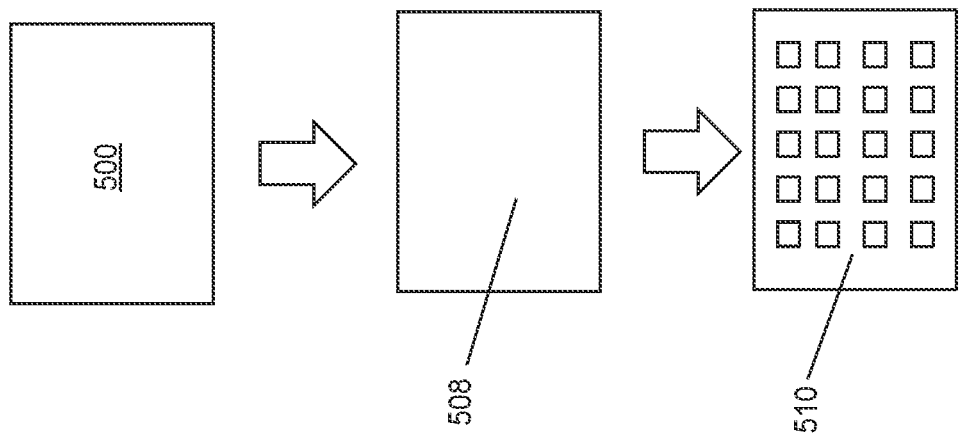
FIG. 5, which includes
Figure 5:
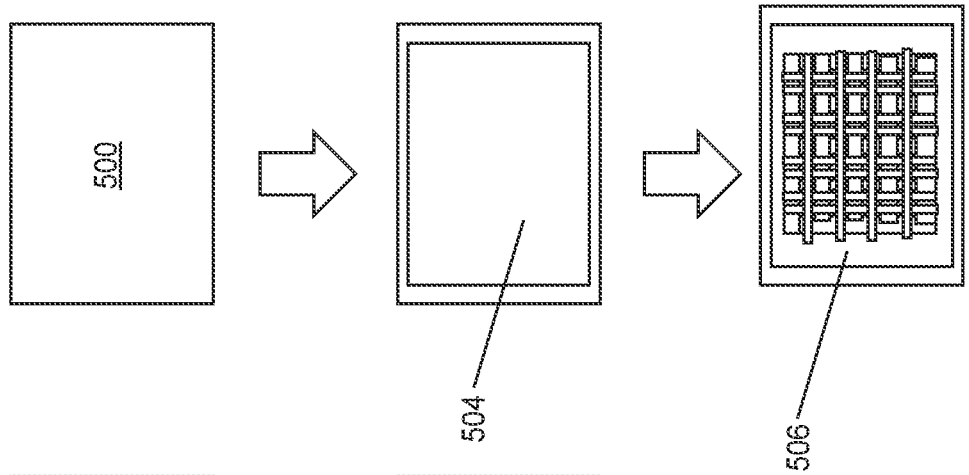
Figure 5:
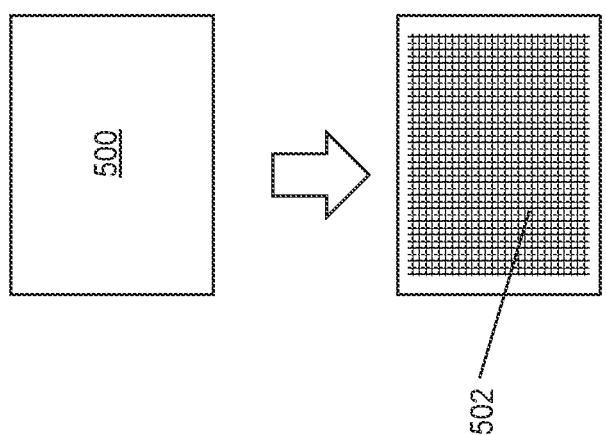

Referring to FIG. 5, a method of adapting the packaging substrate panels 500 is depicted. This panel adaptation can be performed using the non-linear package assembly line 200 in the manner previously described. FIG. 5A depicts a method of adapting a packaging substrate panel 500 for a first package type, FIG. 5B depicts a method of adapting a packaging substrate panel 500 for a second package type, and FIG. 5C depicts a method of adapting a packaging substrate panel 500 for a third package type, wherein the first, second and third package types are each different from one another. According to an embodiment, the first package type is a Fan-Out Wafer Level Package (FO-WLB, e.g. eWLB) package type, the second package type is the TSLP package type, and the third package type is the VQFN package type. For the first package type, an adhesive layer 502 is applied to the top surface of the panel 500. Dies can be attached directly to the adhesive layer 502, and subsequent processing can be performed thereafter. For the second package type, an electrical insulator 504 is formed on the top surface of the panel 500. Subsequently, a lead frame 506 is provided on the electrical insulator 504. The lead frame 506 can be separately manufactured. For the third package type, a metal layer 508 is formed on the top surface of the panel 500. The metal layer 508 can be pre-formed on the panel 500 with a certain thickness, e.g., 12 µm, 17.5 µm, 35 µm, etc. Additive or subtractive processes can be used to achieve desired and eventually locally differing thicknesses (e.g., half-etch). Subsequently, the metal layer 508 can be structured to provide a desired lead-frame configuration with a plurality of die pads.

Referring to FIGS. 6-11, process flows for forming various package types using the non-linear package assembly line 200 are depicted. Each process flow is different from the other with respect to at least one processing step and/or the order of processing steps. However, the process flows for each package types follows the same basic sequence: (1) substrate/carrier adaptation; (2) die attach; and (3) interconnect/separation. According to an embodiment, the clusters of the non-linear package assembly line 200 are grouped according to one of these categories. For example, one or more of the clusters can include all of the necessary tools for substrate/carrier adaptation, one or more of the clusters can include all of the necessary tools for die attach, and one or more of the clusters can include all of the necessary tools for interconnect. Two or more clusters with identical processing tools can be provided in the assembly line 200 so as to increase throughput and enable simultaneous processing of common steps.

Figure 6:
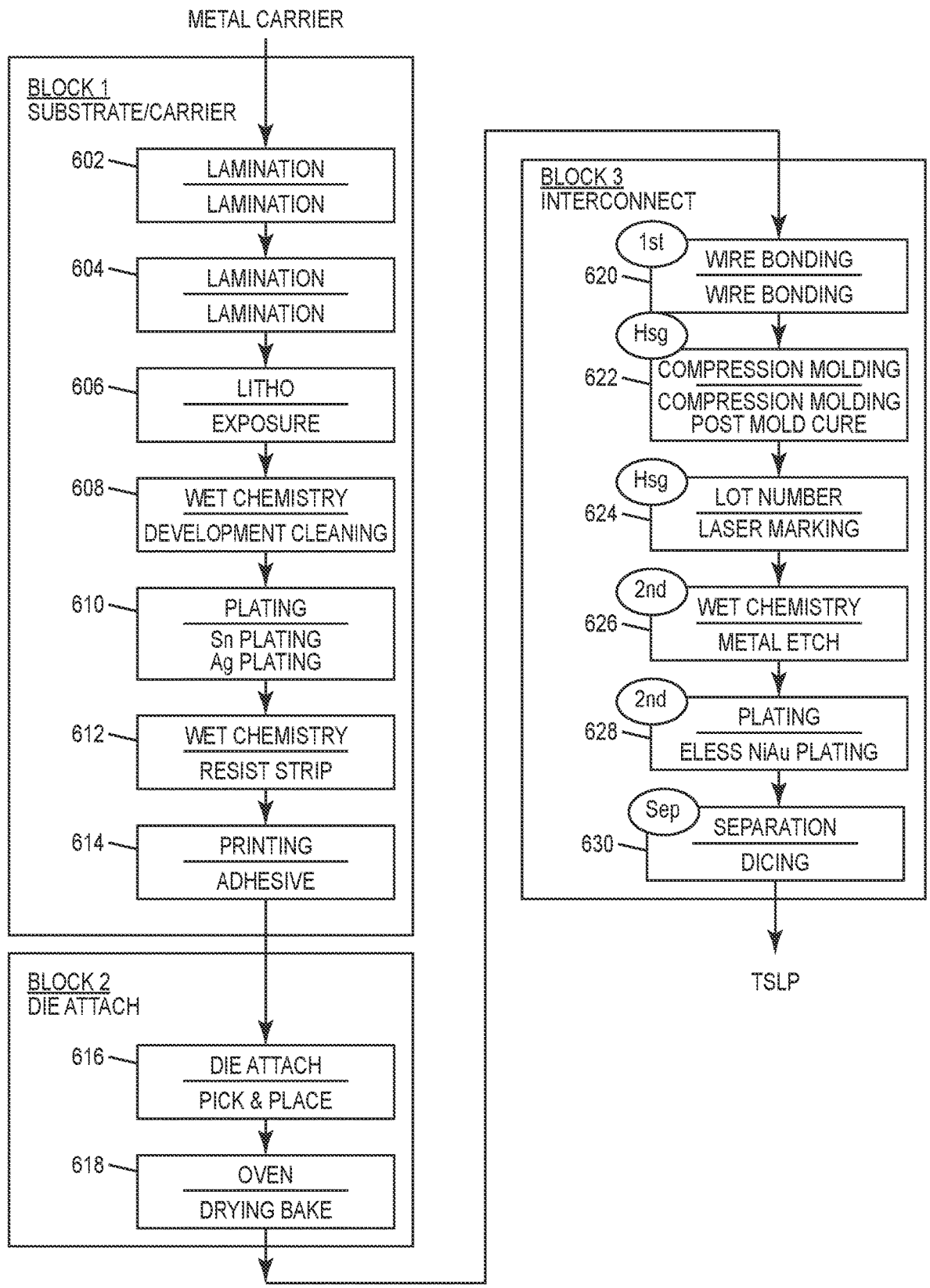
FIG. 6 depicts a process flow for manufacturing a TSLP type package using a non-linear package assembly line, according to an embodiment.

Referring to FIG. 6, a process flow for manufacturing a TSLP type package using the non-linear package assembly line 200 is depicted, according to an embodiment. According to the process flow, substrate/carrier adaptation includes two lamination steps 602, 604, followed by a lithography step 606, followed by a chemical cleaning step 608, followed by an Sn/Tn plating step 610, followed by a chemical resist removal step 612, followed by an adhesive application step. Die attach includes pick and placement of semiconductor dies on the package sites 616, followed by oven bake 618. Interconnect/separation includes wire bonding 620, followed by compression molding 622, followed by lot number laser marking 624, followed by metal etching 626, followed by electroless Ni/Au plating 628, followed by dicing of the packages 630.

Figure 7:
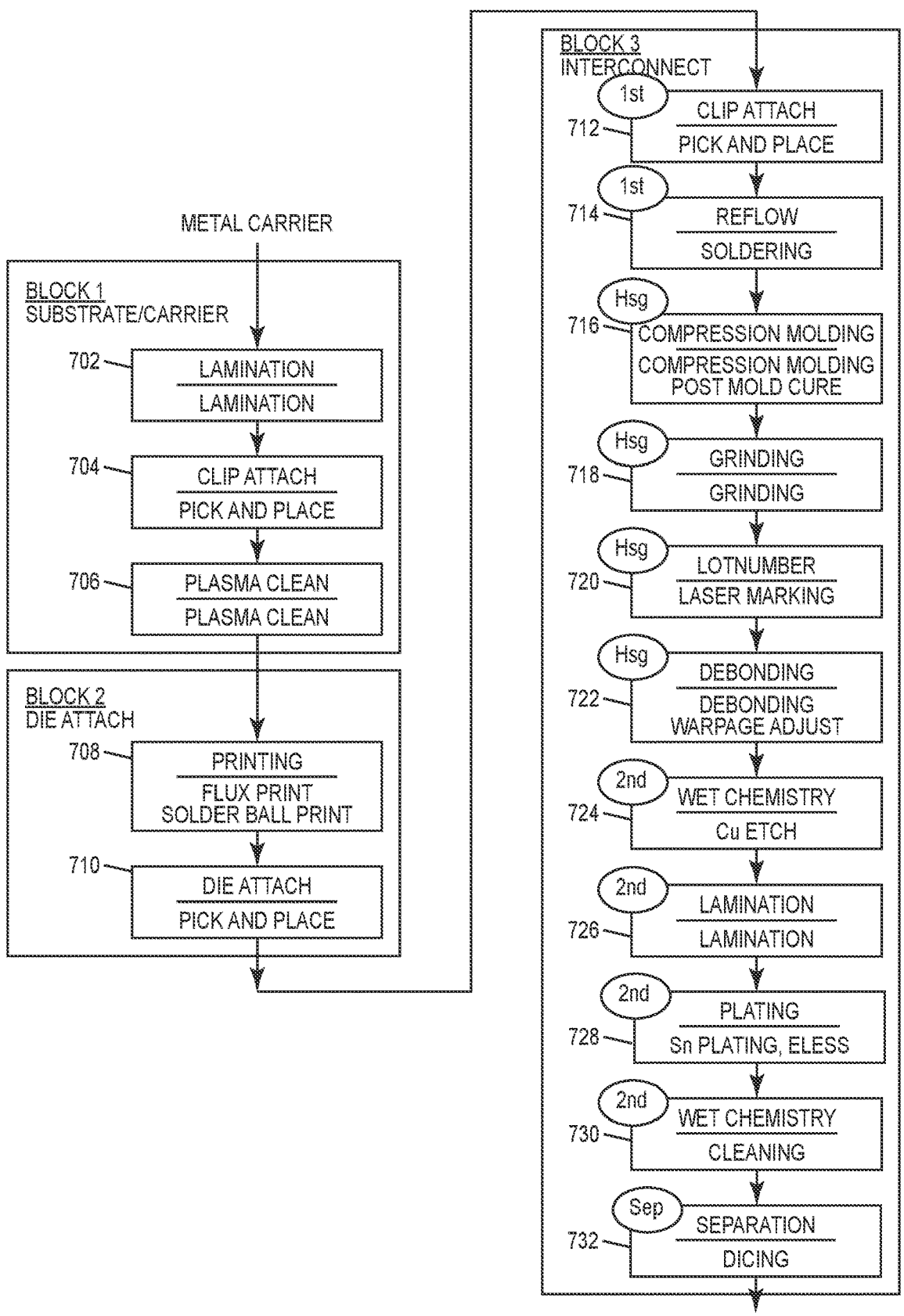
FIG. 7 depicts a process flow for manufacturing a SSO8 type package using a non-linear package assembly line, according to an embodiment.

Referring to FIG. 7, a process flow for manufacturing a SSO8 type package using the non-linear package assembly line 200 is depicted, according to an embodiment. In this embodiment, an externally provided lead frame is used, e.g., in the manner described with reference to FIG. 5B. According to the process flow, substrate/carrier adaptation includes a lamination step 702, followed by attachment/placement of the lead frame on the packaging substrate panels 704, followed by a plasma cleaning step 706. Die attach includes printing of solder balls on the lead frame 708, followed by pick and placement of semiconductor dies on the package sites of the lead frame 710. Interconnect/separation includes pick and placement of the package leads 712, followed by solder reflow 714, followed by compression molding 716, followed by grinding 718, followed by lot number laser marking 720, followed by deboning warpage adjust 722, followed by copper etching 722, followed by lamination 726, followed by electroless Sn plating 728, followed by chemical cleaning 730, followed by dicing of the packages 732.

Figure 8:
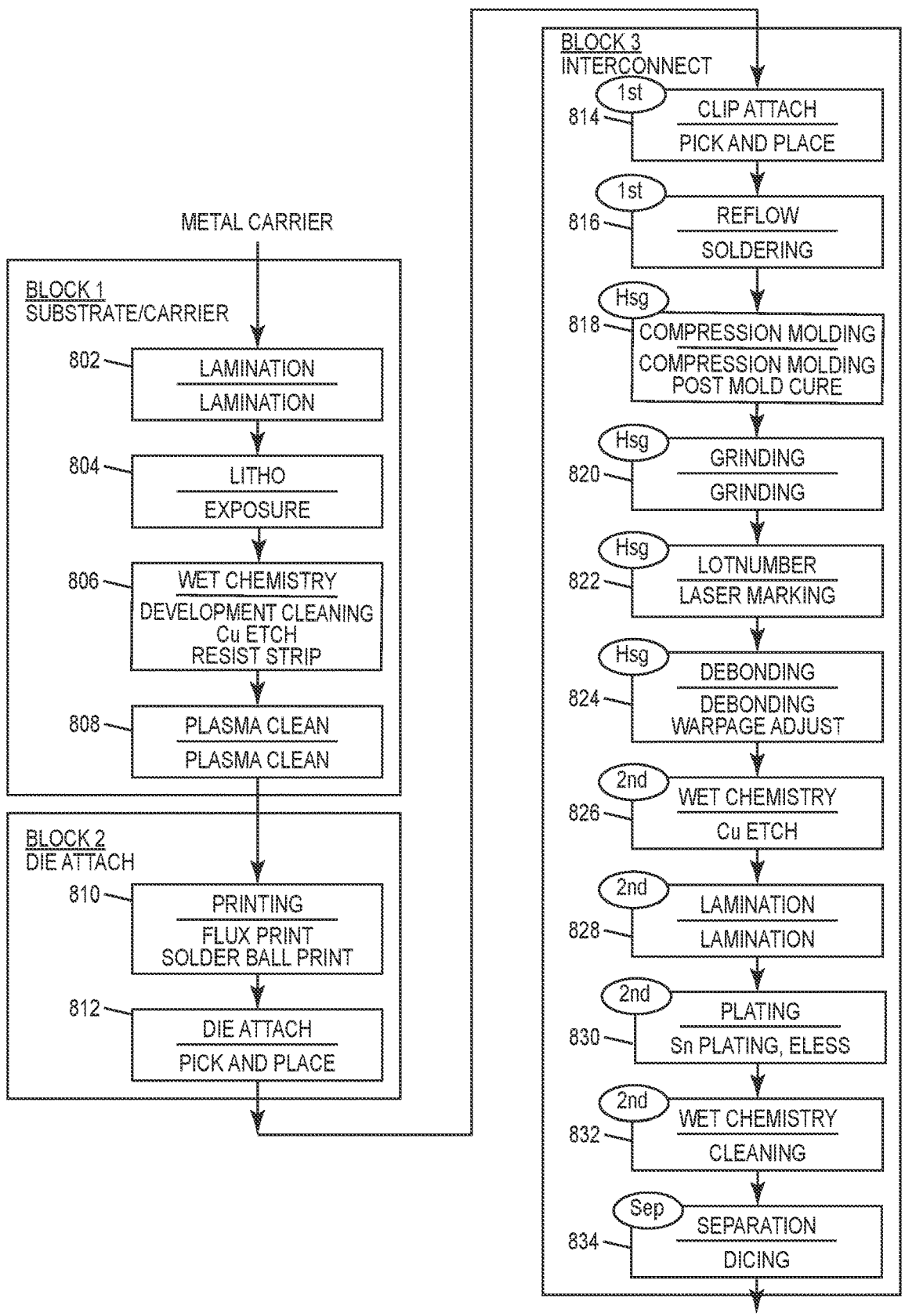
FIG. 8 depicts a process flow for manufacturing a SSO8 type package using a non-linear package assembly line, according to another embodiment.

Referring to FIG. 8, a process flow for manufacturing a SSO8 type package using the non-linear package assembly line 200 is depicted. In this embodiment, the lead frame is formed directly on a conductive layer of the packaging panel as part of the package adaptation step, e.g., in the manner described with reference to FIG. 5C. According to the process flow, substrate/carrier adaptation includes a lamination step 802, followed by lithography 804 applied to the conductive layer of the packaging panel, followed by chemical development/etching and photoresist stripping 806 of the conductive layer of the packaging panel, followed by a plasma cleaning step 808. Die attach includes printing of solder balls on the lead frame, 810 followed by pick and placement of semiconductor dies on the package sites of the lead frame 812. Interconnect/separation includes pick and placement of the package leads 814, followed by solder reflow 816, followed by compression molding 818, followed by grinding 820, followed by lot number laser marking 822, followed by debonding warpage adjust 824, followed by copper etching 826, followed by lamination 828, followed by electroless Sn plating 830, followed by chemical cleaning 832, followed by dicing of the packages 834.

Figure 9:
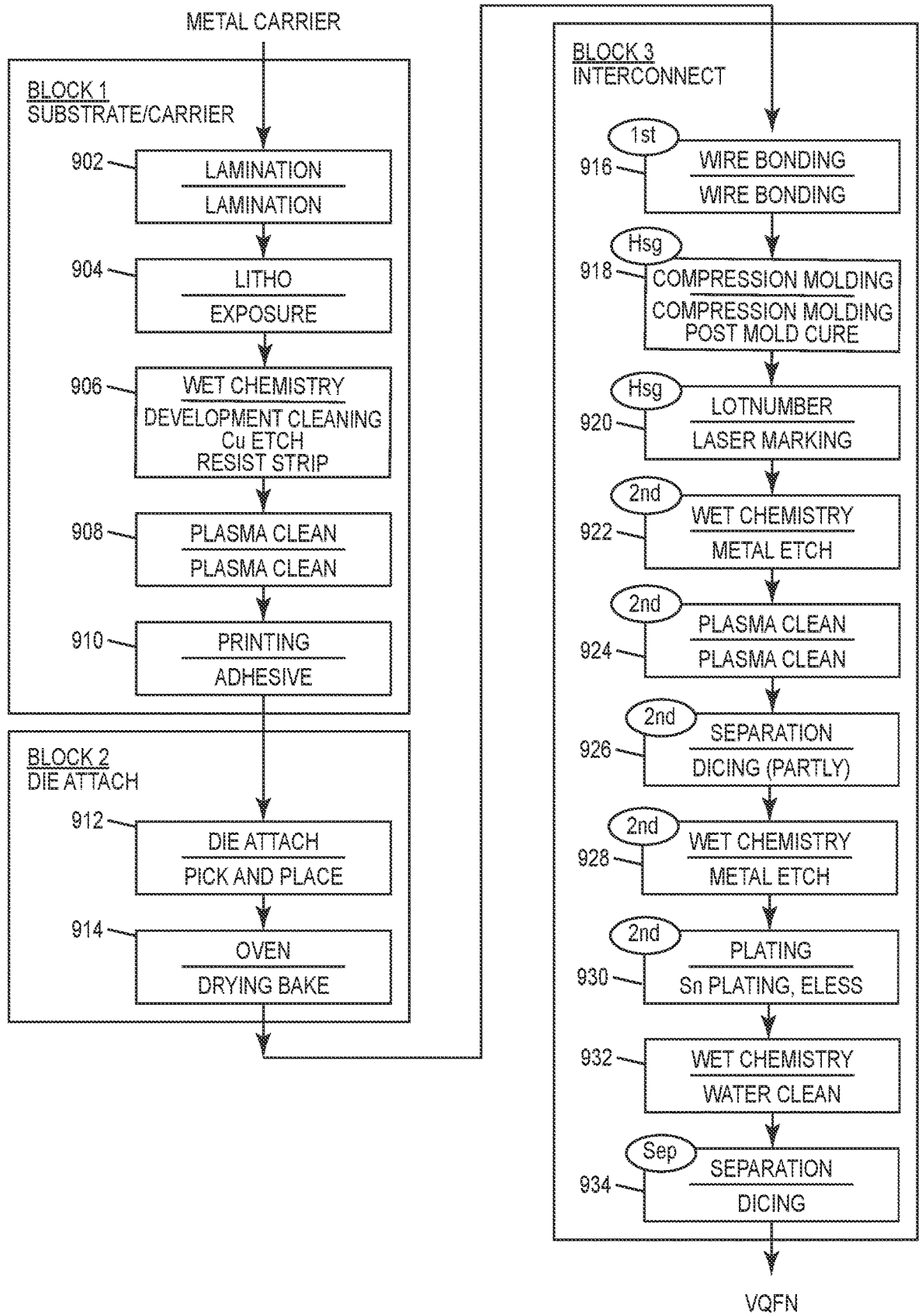
FIG. 9 depicts a process flow for manufacturing a VQFN type package using a non-linear package assembly line, according to an embodiment.

Referring to FIG. 9, a process flow for manufacturing a VQFN type package using the non-linear package assembly line 200 is depicted, according to an embodiment. In this embodiment, the lead frame is formed directly on a conductive layer of the packaging panel as part of the package adaptation step, e.g., in the manner described with reference to FIG. 5C According to the process flow, substrate/carrier adaptation includes a lamination step 902, followed by lithography 904 applied to the conductive layer of the packaging panel, followed by chemical development/etching and photoresist stripping of the conductive layer of the packaging panel 906, followed by a plasma cleaning step 908, followed by a printing step 910. Die attach includes pick and placement of semiconductor dies on the package sites of the lead frame 912, followed by an oven bake 914. Interconnect/separation includes wire bonding or first level interconnect 916, followed by compression molding 918, followed by lot number laser marking 920, followed by metal etching 922, followed by plasma clean 924, followed by partial package separation 926, followed by a further metal etching 928, followed by electroless SN plating 930, followed by water cleaning 932, followed by complete package separation 934.

Figure 10A:
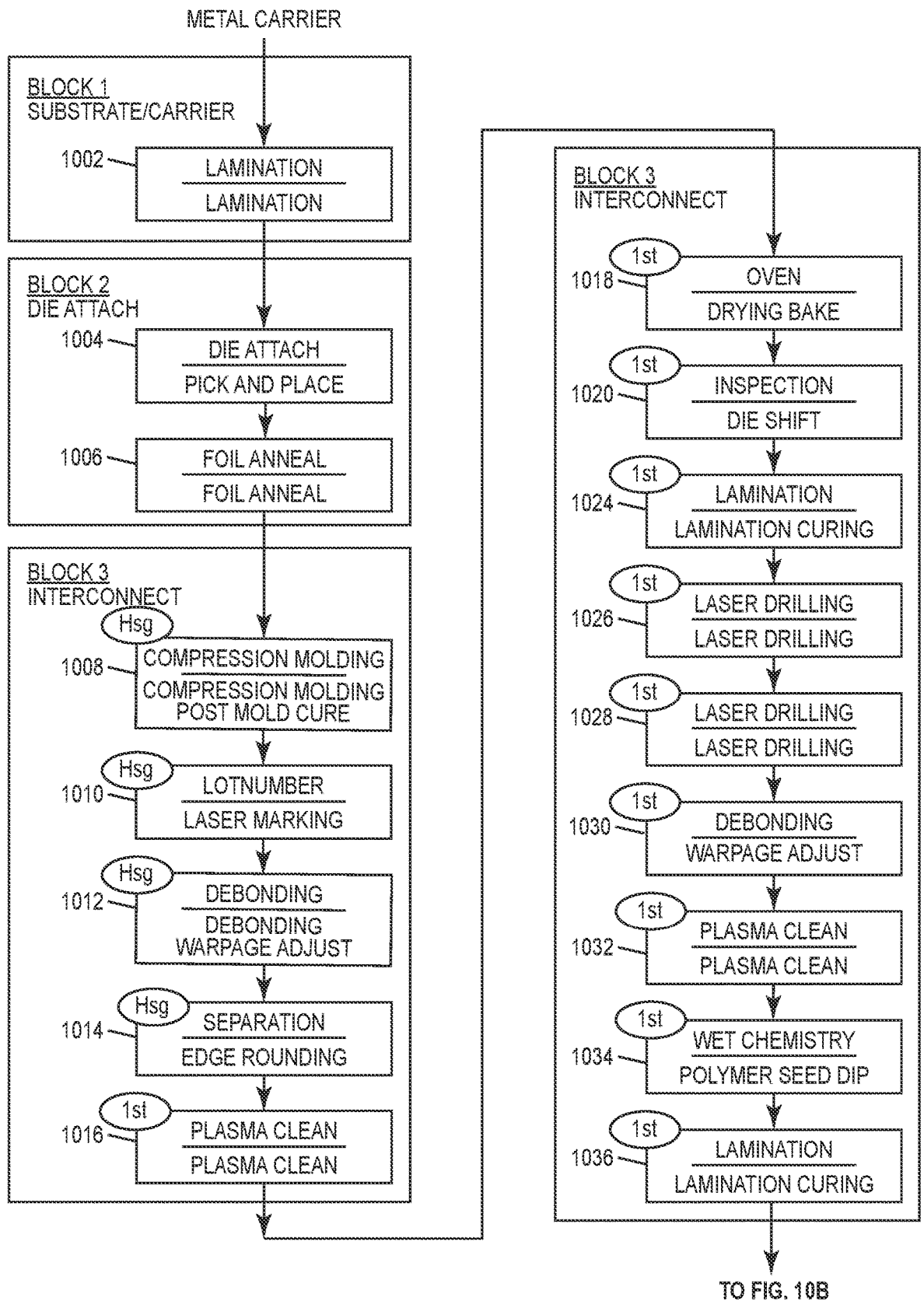
FIGS. 10A and 10B, depicts a process flow for manufacturing an eWLB type package type package using a non-linear package assembly line, according to an embodiment.
Figure 10B:
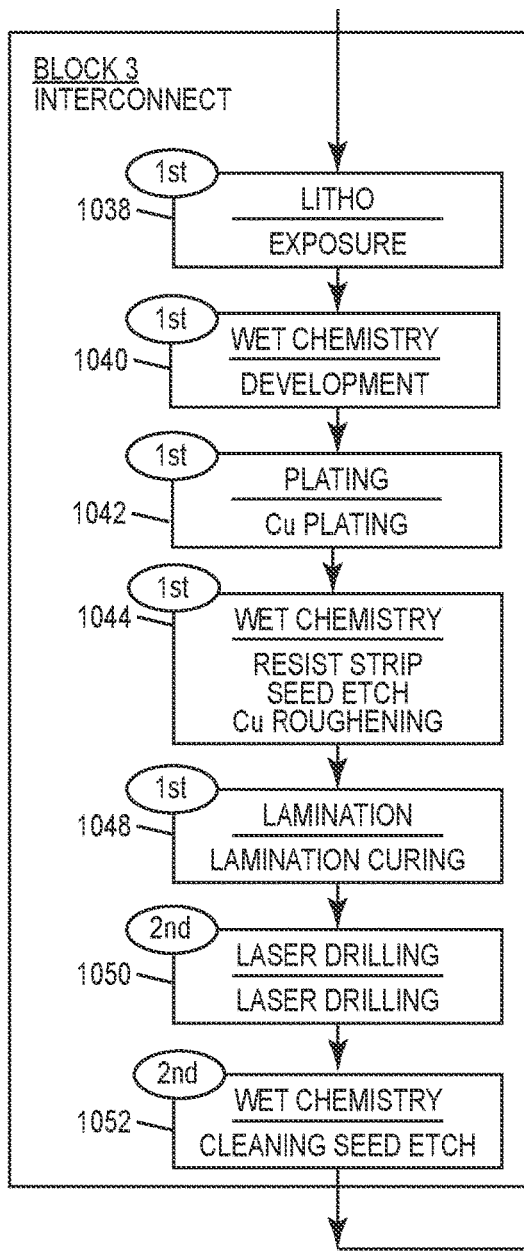
Figure 10B:
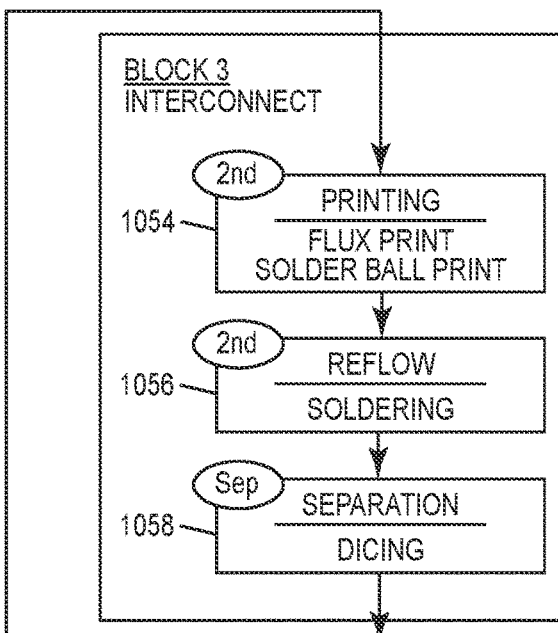

Referring to FIG. 10, a process flow for manufacturing Fan-Out Wafer Level Package type package (based on the eWLB package) using the non-linear package assembly line 200 is depicted, according to an embodiment. According to the process flow, substrate/carrier adaptation includes a lamination step 1002. Die attach includes pick and placement of semiconductor dies 1004, followed a foil annealing step 1006. Interconnect/separation includes compression molding 1008, followed by lot number laser marking 1010, followed by debonding warpage adjust 1012, followed by edge rounding 1014, followed by plasma clean 1016, followed by oven bake 1018, followed by die inspection 1020, followed by lamination 1024, followed by laser drilling 1026, followed by laser drilling 1028, followed by debonding 1030, followed by plasma cleaning 1032, followed by polymer seed dip 1034, followed by lamination 1036, followed by lithography exposure 1038, followed by development 1040, followed by Cu plating 1042, followed by chemical processing that includes resist strip, seed layer etch and Cu roughening 1044, followed by lamination 1048, followed by laser drilling 1050, followed by chemical processing that includes cleaning and seed layer etch 1052, followed by solder ball printing 1054, followed by solder reflow 1056, followed by package separation 1058.

Figure 11A:
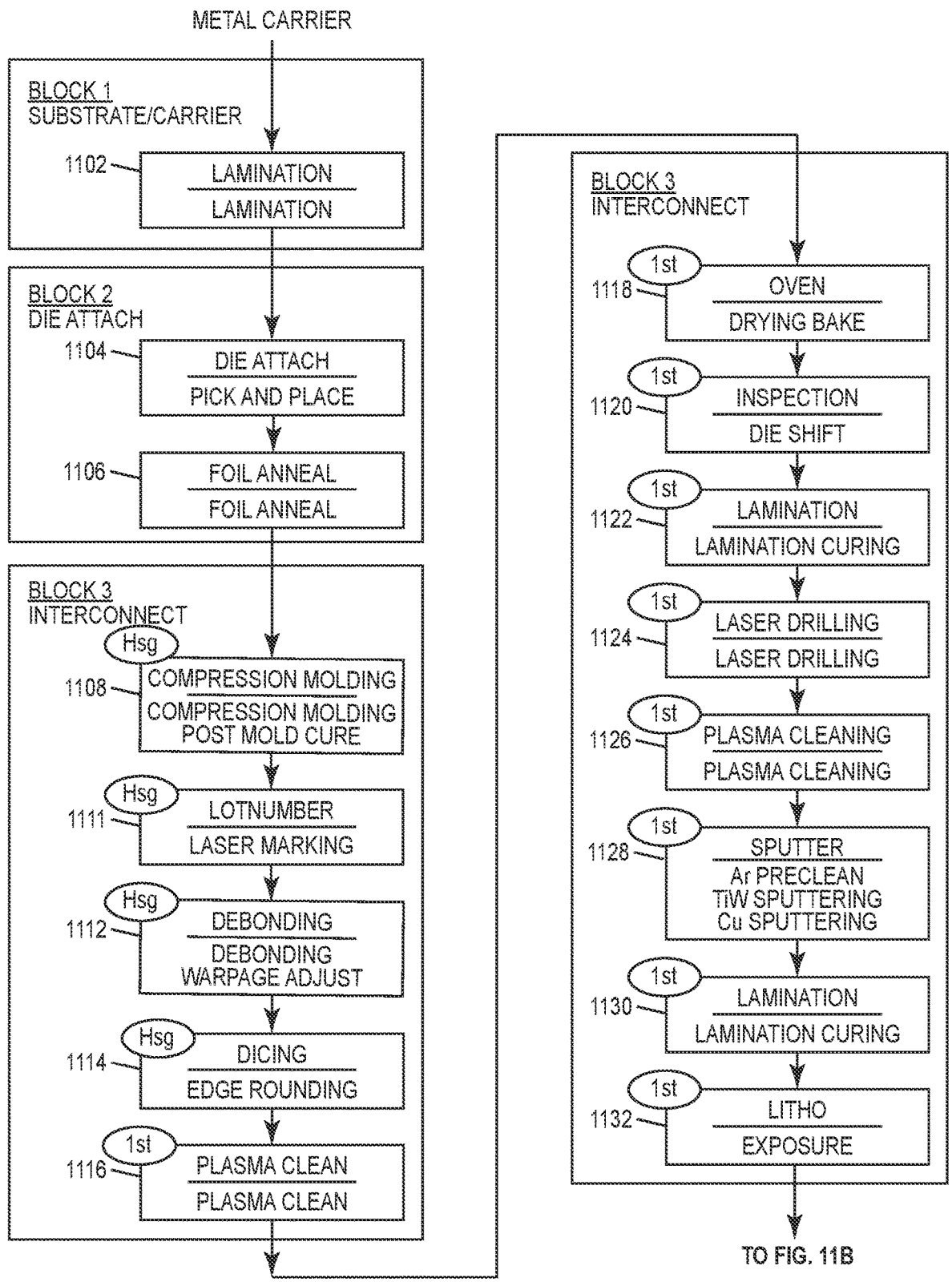
FIGS. 11A and 11B, depicts a process flow for manufacturing an eWLB type package type package using a non-linear package assembly line, according to another embodiment.
Figure 11B:
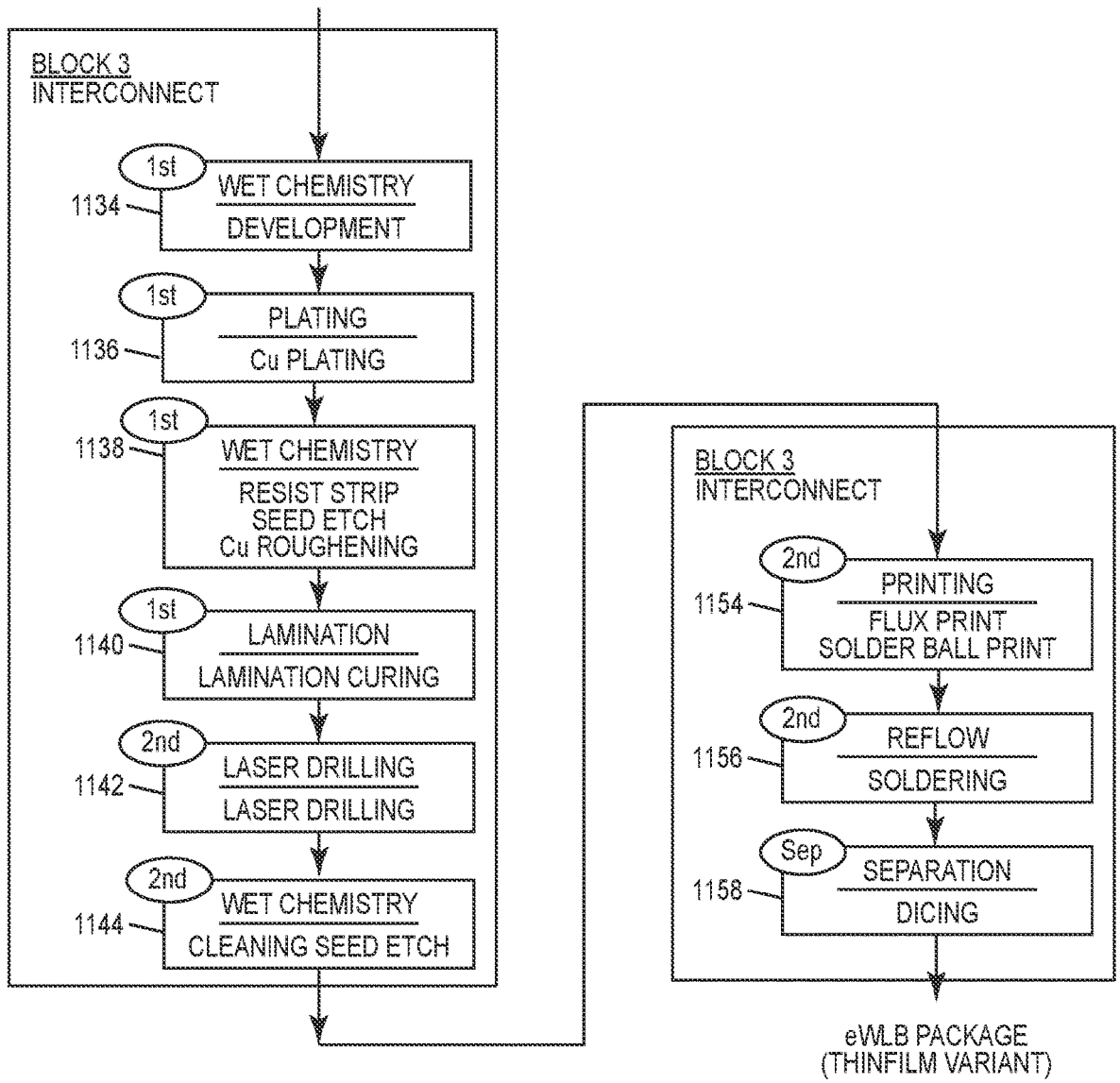
Figure 12:
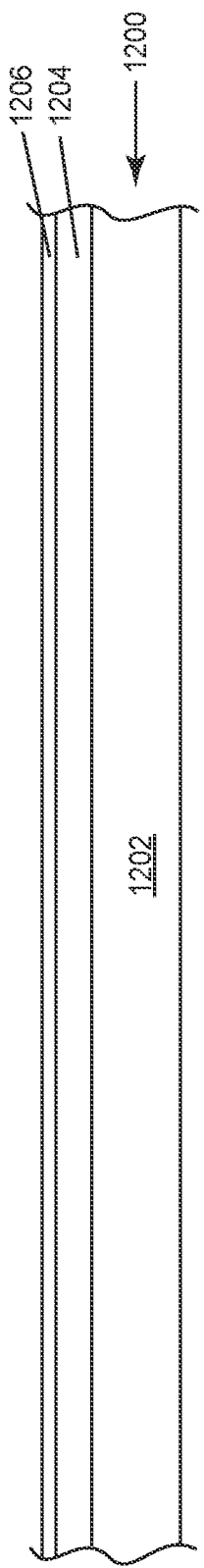
FIG. 12, which includes
Figure 12:
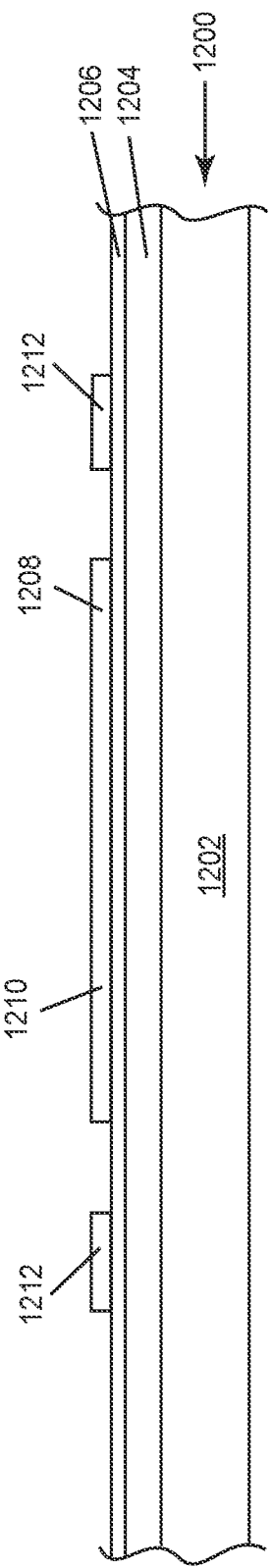
Figure 12:
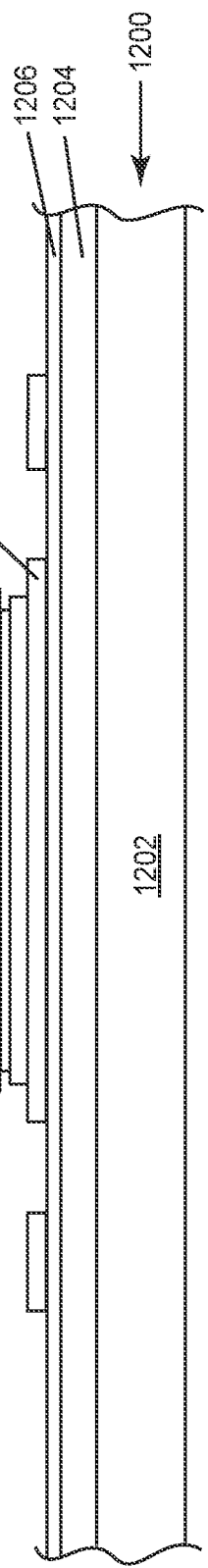
Figure 13:
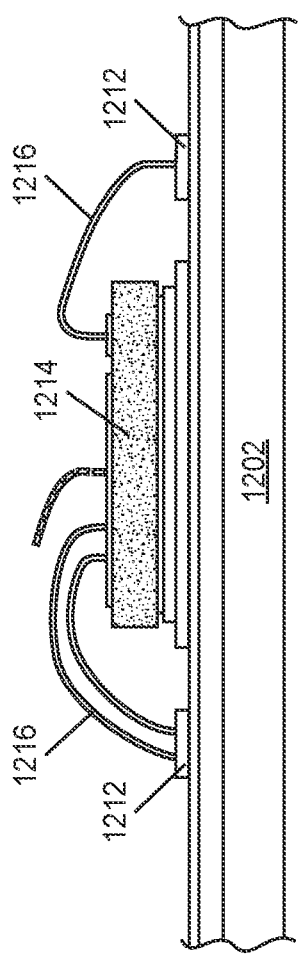
FIG. 13, which includes
Figure 13:
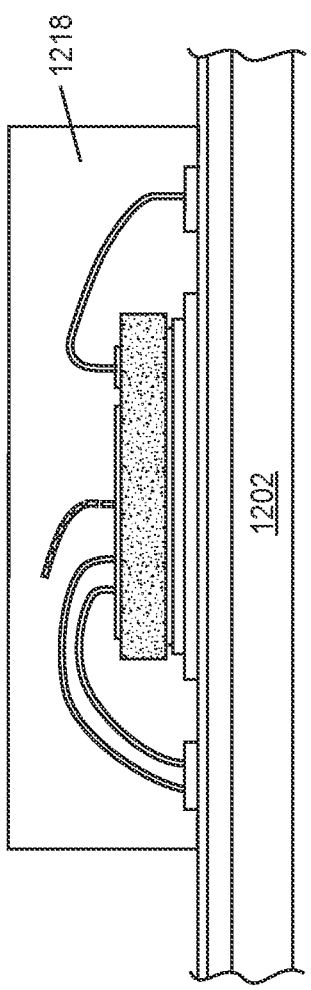
Figure 13:
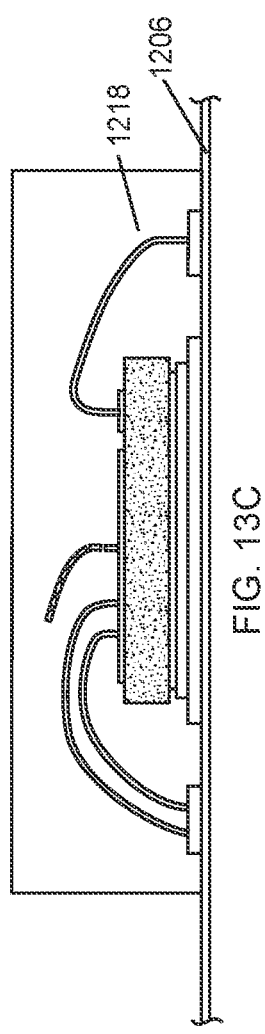
Figure 14:
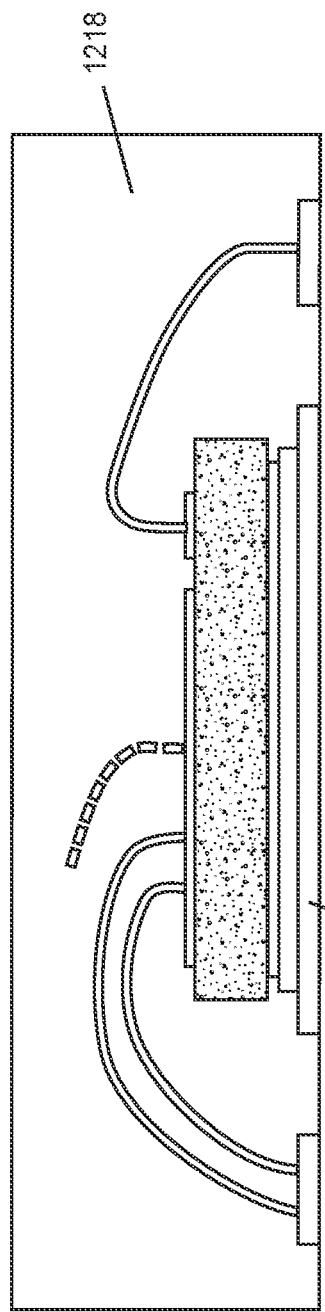
FIG. 14, which includes
Figure 14:
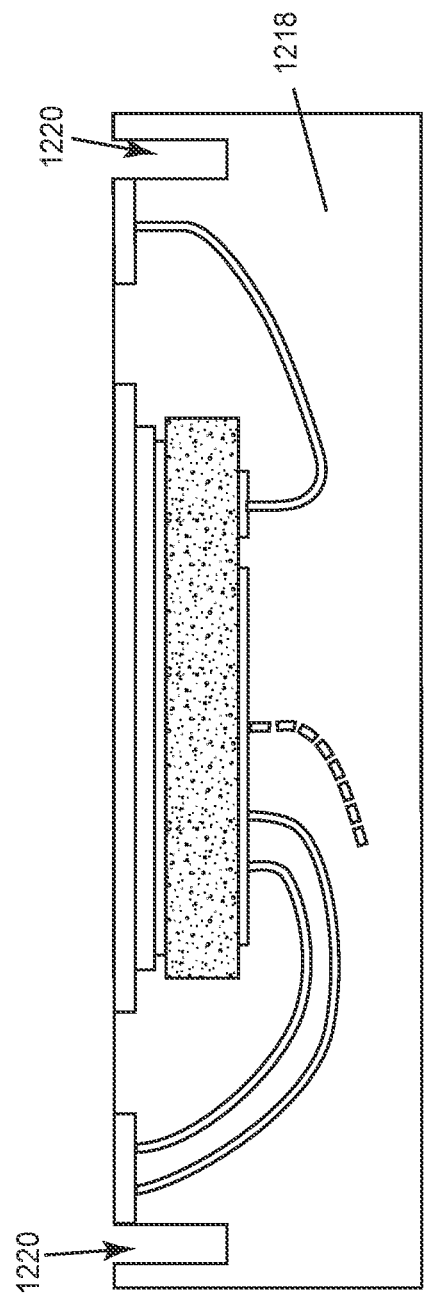

Referring to FIG. 11, a process flow for manufacturing Fan-Out Wafer Level Package type package (based on the eWLB package) type package using the non-linear package assembly line 200 is depicted, according to an another embodiment. According to the process flow, substrate/carrier adaptation includes a lamination step 1102. Die attach includes pick and placement of semiconductor dies 1104, followed a foil annealing step 1106. Interconnect/separation includes compression molding 1108, followed by lot number laser marking 1110, followed by debonding warpage adjust 1112, followed by edge rounding 1114, followed by plasma clean 1116, followed by oven bake 1118, followed by die inspection 1120, followed by lamination 1112, followed by laser drilling 1124, followed by plasma cleaning 1126, followed by TiW and Cu sputtering 1128, followed by lamination 1130, followed by lithography 1132, followed by development 1134, followed by Cu plating 1136, followed by chemical processing that includes resist strip, seed layer etch and Cu roughening 1138, followed by lamination 1140, followed by laser drilling 1142, followed by chemical processing that includes cleaning and seed layer etch 1144, followed by solder ball printing 1146, followed by solder reflow 1148, followed by package separation 1150.

Referring to FIGS. 12-15, cross-sectional views a VQFN type package formation process are depicted, according to an embodiment. The VQFN type package is formed using the using the non-linear package assembly line 200 described herein.

Referring to FIG. 12A, a packaging substrate panel 1200 is provided. The packaging substrate panel 1200 includes an aluminum plate 1202, a polymer layer 1204, and a thin copper layer 1206. The polymer layer 1204 can be a mold compound or a multi-layer material. The thin copper layer 1206 can have varying thicknesses such as 12 µm, 17.5 µm, 35 µm, etc.

Referring to FIG. 12B, a structured copper layer 1208 is formed on the packaging substrate panel over the thin copper layer. The structured copper layer 1028 can be formed by a masking, electroplating, and etching steps. The copper layer is structured to include a die pad 1210 and bond pads 1212. According to an embodiment, the die pad 1210 of the structured copper layer is thicker than the adjacent bond pads 1212.

Referring to FIG. 12C, a die 1214 is attached to the die pad 1210. This can be done according to any of a variety of techniques, including soldering, sintering, gluing, compression bonding, etc.

Referring to FIG. 13A, electrical connections 1216, i.e., first level interconnects, between the die 1214 and the bond pads 1212 are formed. This can be done according to any of a variety of techniques, including wire bonding, clip attachment, or a mixture of both. In the case of very large size panels, e.g., 18"×24" or greater, the wire bonder may not have a large enough working area to complete wire bonds for every package on the panel. In that case, wire bonding may be completed by performing wire bonding on one half of the packaging sites on the panel, rotating the panel, and performing wire bonding on the other half of packaging sites on the panel.

Referring to FIG. 13B, an overmolding process is performed. According to this process, the die 1214 and the electrical connections 1216 are encapsulated by an electrically insulating mold compound 1218, such as a thermosetting plastic. A compression molding or injection molding technique may be utilized.

Referring to FIG. 13C, portions of the packaging substrate panel 1200 are removed. Specifically, the aluminum plate 1202 and the polymer layer 1204 are removed. This may be done by a wet chemical etch, for example.

Referring to FIG. 14A, the thin copper layer 1206 is removed. This can be done using an isotropic etching technique, for example.

Referring to FIG. 14B, a partial dicing/separation process is applied to the lower side of the devices. Specifically, notches 1220 are formed at a lower side of the device. This may be done by blade dicing or laser drilling, for example. The notches 1220 extend at least through the structured copper layer 1210 so as to reach the mold compound 1218.

Referring to FIG. 15A, a solderable noble metal layer 1222 is formed on the structured copper layer. According to an embodiment, the solderable noble metal layer 1222 is formed by electroless plating. The electroless plating may be a tin based plating, such as Sn or SnAG. The plating forms on the exposed copper portions of the metal layer 1208, specifically on an underside of the die pad 1210 and the bond pads 1212 as well as inner sides of the bond pads 1212 that are disposed within the notches 1120.

Referring to FIG. 15B a complete package separation process is performed. The packages are separated along the notches. This may be done by blade dicing, for example.

The partial dicing/separation process and the electroless plating process in the above depicted embodiment enable the production of a VQFN type package using the non-linear package assembly line 200. After packaging substrate panel 1200 has been removed by the step of FIG. 14A, the die pad 1210 and the bonding pads 1212 are completely or partially embedded within the molding compound 1218. Further processing is needed to make these second level interconnection points solderable and in conformity with the lead design of the VQFN type package. By forming the notches 1220 that extend through the bonding pads 1212, sides of the bonding pads 1212 that are perpendicular to the lower side of the package are exposed. These sides are electroplated to form package level terminals at the corners of the package. In addition, the lower side of the die pad 1210 is electroplated to form a connection terminal with a lower side of the die 1214.

Figure 16:
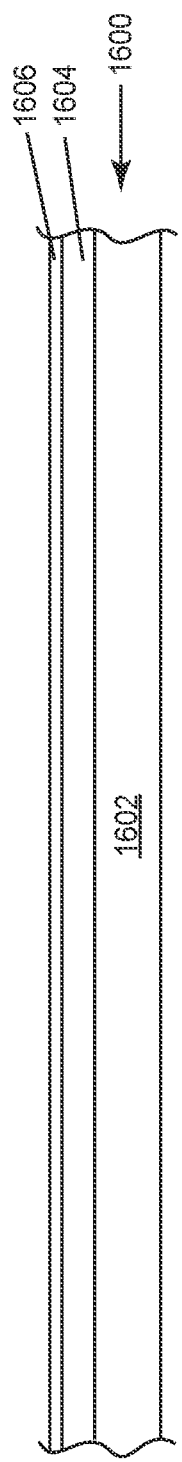
FIG. 16, which includes
Figure 16:
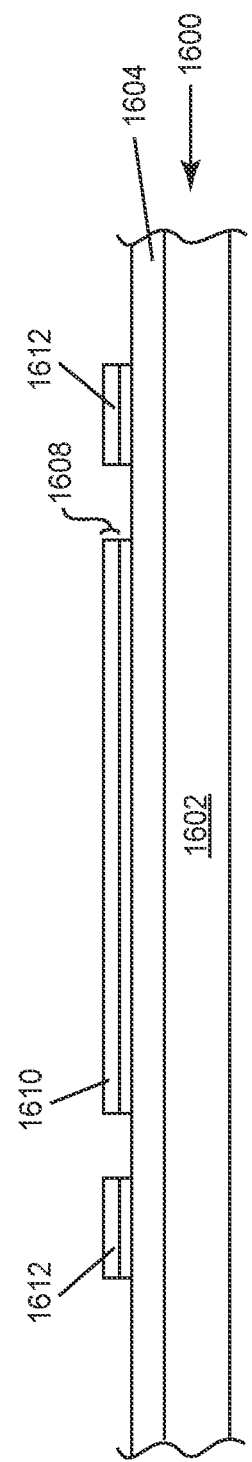
Figure 16:
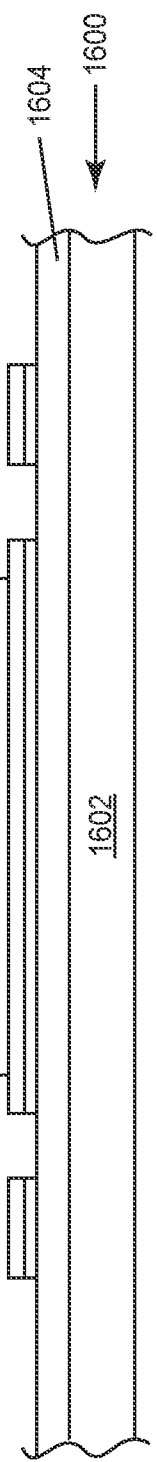
Figure 17:
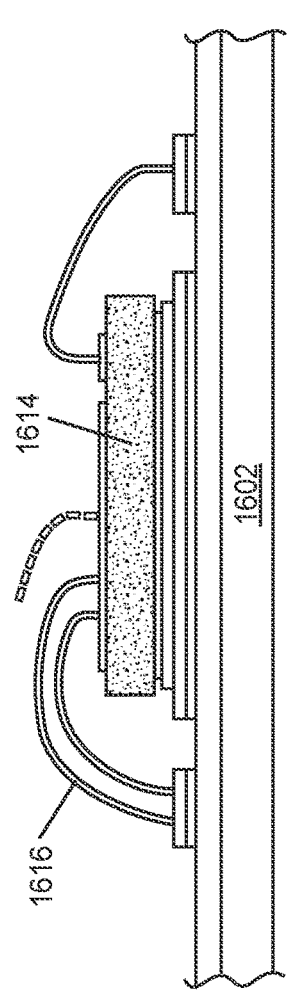
FIG. 17, which includes
Figure 17:
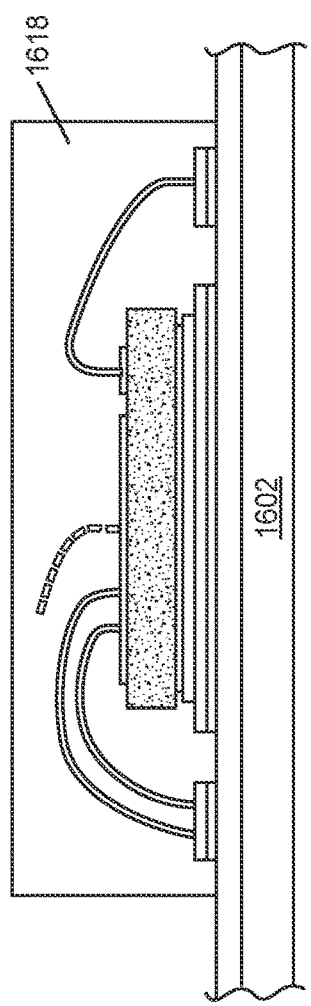
Figure 17:
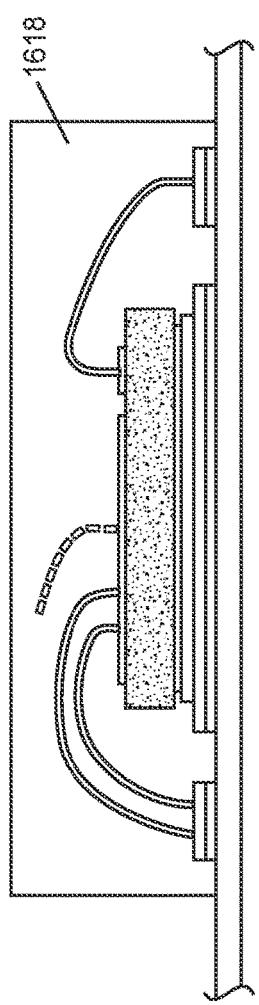
Figure 18:
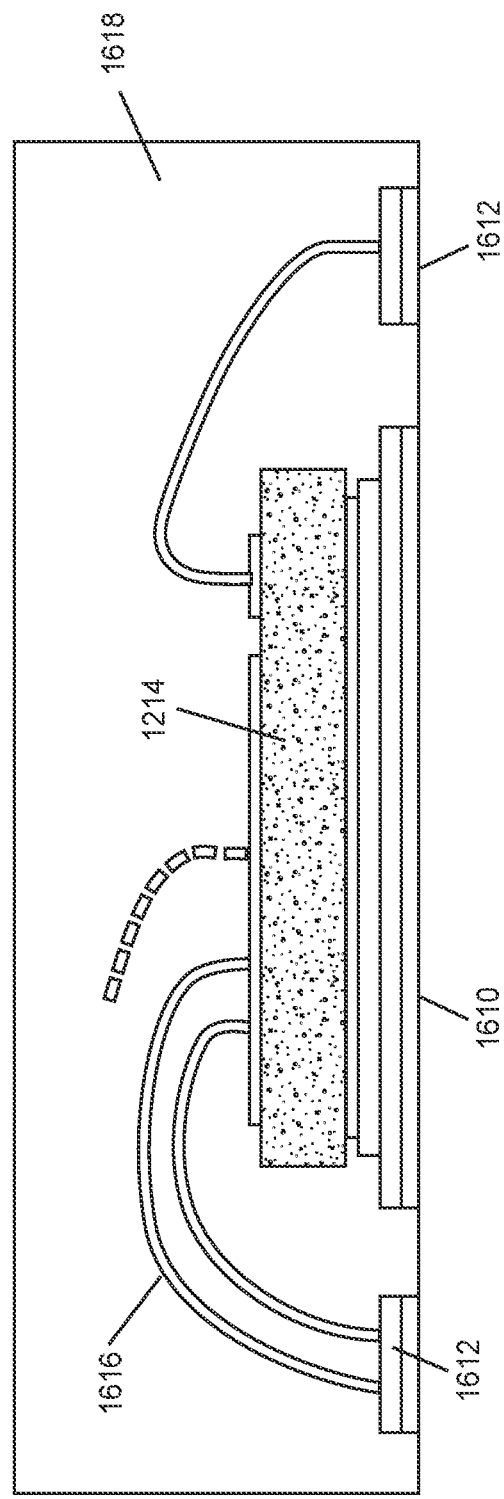
FIG. 18, depicts selected process steps for forming a VQFN type package using a non-linear package assembly line, according to another embodiment that is different than the embodiment described with reference to FIGS. 12-15.

Referring to FIGS. 16-18, cross-sectional views a VQFN type package formation process is depicted, according to another embodiment. The VQFN type package may be formed using the using the non-linear package assembly line 200.

Referring to FIG. 16A, a packaging substrate panel 1600 is provided. The packaging substrate panel 1600 includes an aluminum plate 1602, a polymer layer 1604, and a thin copper layer 1606. The polymer layer 1604 can be a mold compound or a multi-layer material. The thin copper layer 1606 can have varying thicknesses, including 12 µm, 17.5 µm, 35 µm, etc.

Referring to FIG. 16B, a second level metallization layer 1608 is formed on the copper layer 1606. The second level metallization layer 1608 can be formed by sputtering, electroplating, and etching steps, for example. The second level metallization layer 1608 and the copper layer 1606 are both structured to form a die pad 1610 and a number of bond pads 1612. According to an embodiment, the die pad 1610 is thicker than the adjacent bond pads 1612. The copper layer 1606 and the second level metallization layer 1608 can be structured by masking, electroplating, and etching steps, for example.

Referring to FIG. 16C, a die 1614 is attached to the die pad 1610. This can be done according to any of a variety of techniques, including soldering, sintering, gluing, compression bonding, etc.

Referring to FIG. 17A, electrical connections 1616, i.e., first level interconnects, between the die 1614 and the bond pads 1612 are formed. This can be done according to any of a variety of techniques, including wire bonding, clip attachment, or a mixture of both. In the case of very large size panels, e.g., 18"×24" or greater, the wire bonder may not have a large enough working area to complete wire bonds for every package on the panel. In that case, wire bonding may be completed by performing wire bonding on one half of the packaging sites on the panel, rotating the panel, and performing wire bonding on the other half of packaging sites on the panel.

Referring to FIG. 17B, an overmolding process is performed. According to this process, the die 1614 and the electrical connections 1616 are encapsulated by an electrically insulating mold compound 1618. A compression molding or injection molding technique may be utilized.

Referring to FIG. 17C, the aluminum plate 1602 is removed. This may be done by a wet chemical etch, for example.

Referring to FIG. 18, the polymer layer 1604 is removed. This may be done by a wet chemical etch, for example. As a result, the die pad 1610 and the bond pads 1612 are embedded in the mold compound 1618, but are accessible at a lower side of the device. A final coating can be applied to the die pad 1610 and the bond pads 1612, e.g., by electroless plating or printing. As a result, a complete packaged device can be achieved.

Figure 19:
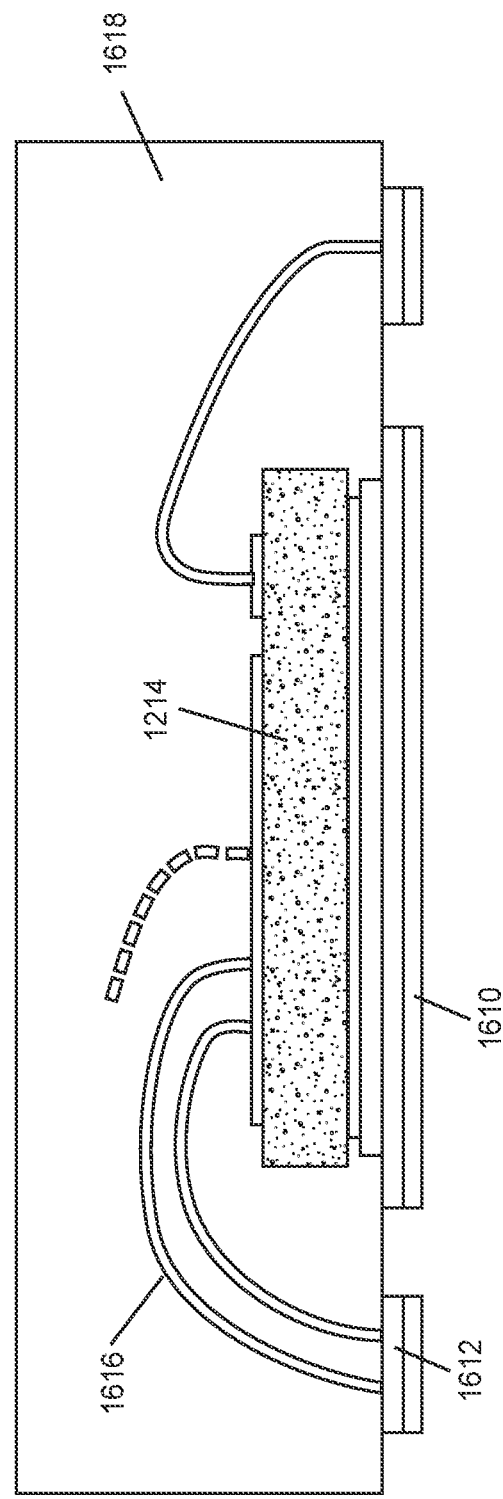
FIG. 19 depicts a VQFN package that is formed using a non-linear package assembly line, according to another embodiment that is different than the embodiment described with reference to FIGS. 12-16 and is different than the embodiment described with reference to FIGS. 16-18.

Referring to FIG. 19, a VQFN type package is depicted according to another embodiment. In this embodiment, the same processing steps as described with reference to FIGS. 16-18 are performed with the exception of the following. The copper layer 1606 is selected to be thicker, e.g., 35 μm or more. Moreover, the copper layer 1606 and the second level metallization 1608 are not structured prior to the die attachment, wirebonding and molding steps described in FIGS. 16 and 17. Instead, the copper layer 1606 and the second level metallization 1608 are structured after removing the aluminum plate 1602 and the polymer layer 1604. In this way, the device can be configured in such a way that the structured metal layers (i.e., the die pad 1610 and the bond pads 1612) are exposed from the mold compound, as depicted in FIG. 19.

Terms such as "same," "match" and "matches" as used herein are intended to mean identical, nearly identical or approximately so that some reasonable amount of variation is contemplated without departing from the spirit of the invention. The term "constant" means not changing or varying, or changing or varying slightly again so that some reasonable amount of variation is contemplated without departing from the spirit of the invention. Further, terms such as "first," "second," and the like, are used to describe various elements, regions, sections, etc. and are also not intended to be limiting. Like terms refer to like elements throughout the description.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of producing packaged semiconductor devices, the method comprising:
   providing a first packaging substrate panel;
   providing a second packaging substrate panel; and
   moving the first and second packaging substrate panels through an assembly line that comprises a plurality of package assembly tools using a control mechanism,
   wherein first type packaged semiconductor devices are formed on the first packaging substrate panel and second type packaged semiconductor devices are formed on the second packaging substrate panel,
   wherein the control mechanism moves both of the first and second packaging substrate panels through the assembly line in a non-linear manner,
   wherein the first type packaged semiconductor devices are formed by arranging a first semiconductor die on the first packaging substrate panel and encapsulating the first semiconductor die that is arranged on the first packaging substrate panel with an electrically insulating mold compound body,
   wherein the second type packaged semiconductor devices are formed by arranging a second semiconductor die on the second packaging substrate panel and encapsulating the second semiconductor die that is arranged on the second packaging substrate panel with an electrically insulating mold compound body, and
   wherein the first and second type packaged semiconductor devices differ with respect to at least one of: lead configuration, and encapsulant configuration.

2. The method of claim 1, wherein the first and second type packaged semiconductor devices each comprise electrically conductive leads that are exposed from the mold compound body of the respective first and second type packaged semiconductor devices, and wherein the first and second packaged semiconductor devices differ with respect to a configuration of the electrically conductive leads relative to the mold compound body of the respective completed one of the first and second packaged semiconductor devices.

3. The method of claim 1, wherein the first type packaged semiconductor device is any one of: a transistor outline (TON) package type, a leadless package type, a Wafer Level Ball Grid Array (WLBGA) package type, and a flip chip package type, and wherein the second type packaged semiconductor device is any different one of: the transistor outline (TON) package type, the leadless package type, the Wafer Level Ball Grid Array (WLBGA) package type, and the flip chip package type.

4. The method of claim 1, wherein moving the first packaging substrate panel through the assembly line comprises:
   forming a second level metallization layer on a first metal layer of the first packaging substrate panel; and
   structuring the second level metallization layer and the first metal layer to form a die pad and adjacent bond pads, the die pad and the bond pads being formed in both the first metal layer and the second level metallization layer.

5. The method of claim 4, wherein the first metal layer is a copper layer.

6. The method of claim 4, wherein the first type packaged semiconductor device is a quad flat no leads (QFN) package type.

7. The method of claim 4, wherein moving the first packaging substrate panel through the assembly line further comprises:
   attaching the first semiconductor die to the die pad;
   forming electrical connections between the first semiconductor die and the bond pads;
   encapsulating the first semiconductor die and the electrical connections by the electrically insulating mold compound of the first type packaged semiconductor device; and
   removing portions of the first packaging substrate panel so as to expose the die pad and the bond pads.

8. The method of claim 1, wherein the control mechanism moves the first packaging substrate panel through a first subset of the package assembly tools and moves the second packaging substrate panel through a second subset of the package assembly tools, wherein the first subset of package assembly tools comprises at least one package assembly tool that is not in the second subset, and wherein the second subset of package assembly tools comprises at least one package assembly tool that is not in the first subset.

9. The method of claim 1, wherein the first and second packaging substrate panels are each at least 24"×18".

10. A method of producing packaged semiconductor devices, the method comprising:
   providing first and second packaging substrate panels, each packaging substrate panel comprising a plurality of packaging sites;
   providing an assembly line comprising a plurality of processing tools that are configured to perform package processing to each packaging site in the first and second packaging substrate panels;
   providing a control mechanism that is configured to identify the first and second packaging substrate panels and to load the first and second packaging substrate panels into each one of the processing tools in the assembly line in a non-linear manner;
   moving the first packaging substrate panel through the assembly line using the control mechanism to form first package type packages; and
   moving the second packaging substrate panel through the assembly line using the control mechanism to form second package type packages that are different from the first package type packages,
   wherein the control mechanism loads the first packaging substrate panels into only those processing tools in the assembly line that are required to produce the first package type packages and loads the second packaging substrate panels into only those processing tools in the assembly line that are required to produce the second package type packages,
   wherein the processing tools in the assembly line that are required to produce the first package type packages are different from the processing tools in the assembly line that are required to produce the second package type packages, and
   wherein the first and second package type packages differ with respect to at least one of: lead configuration, and encapsulant configuration,
   wherein moving the first packaging substrate panel through the assembly line comprises:
      forming a second level metallization layer on a first metal layer of the first packaging substrate panel;
      structuring the second level metallization layer and the first metal layer to form a die pad and adjacent bond pads, the die pad and the bond pads being formed in both the first metal layer and the second level metallization layer;
   attaching a die to the die pad;
   forming electrical connections between the die and the bond pads;
   encapsulating the die and the electrical connections by an electrically insulating mold compound; and
   removing portions of the first packaging substrate panel so as to expose the die pad and the bond pads.

* * * * *